(12) United States Patent
Lim et al.

(10) Patent No.: US 11,222,926 B2
(45) Date of Patent: Jan. 11, 2022

(54) LIGHT EMITTING DISPLAY DEVICE INCLUDING CONDUCTIVITY IMPROVEMENT LAYER

(71) Applicant: LG Display Co., Ltd., Seoul (KR)

(72) Inventors: Dong-Hyeok Lim, Goyang-si (KR); Min-Chul Jun, Seoul (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 16/725,829

(22) Filed: Dec. 23, 2019

(65) Prior Publication Data
US 2020/0212123 A1 Jul. 2, 2020

(30) Foreign Application Priority Data
Dec. 28, 2018 (KR) .......................... 10-2018-0173122

(51) Int. Cl.
*H01L 27/32* (2006.01)
*H01L 51/52* (2006.01)
*H01L 51/50* (2006.01)
*H01L 51/56* (2006.01)

(52) U.S. Cl.
CPC ...... *H01L 27/3211* (2013.01); *H01L 51/5056* (2013.01); *H01L 51/5072* (2013.01); *H01L 51/5088* (2013.01); *H01L 51/5092* (2013.01); *H01L 51/5225* (2013.01); *H01L 51/56* (2013.01)

(58) Field of Classification Search
CPC . H01L 51/5225; H01L 51/5072; H01L 51/56; H01L 51/5056; H01L 51/5088; H01L 51/5092; H01L 27/326–3262; H01L 27/3276–3279; H01L 27/3297
See application file for complete search history.

(56) References Cited
U.S. PATENT DOCUMENTS

2017/0262109 A1* 9/2017 Choi .................... H01L 51/5253
2017/0288004 A1* 10/2017 Kim .................... H01L 27/3276
2019/0273125 A1* 9/2019 Takechi .............. H01L 27/3279

* cited by examiner

*Primary Examiner* — Laura M Menz
*Assistant Examiner* — Candice Chan
(74) *Attorney, Agent, or Firm* — Birch, Stewart, Kolasch & Birch, LLP

(57) ABSTRACT

Disclosed are a light emitting display device and a method for manufacturing the same. The light emitting display device changes a configuration of common layers disposed in edge areas and can thus satisfy structural characteristics of a narrow bezel and prevent light leakage generated around the edge areas.

21 Claims, 17 Drawing Sheets

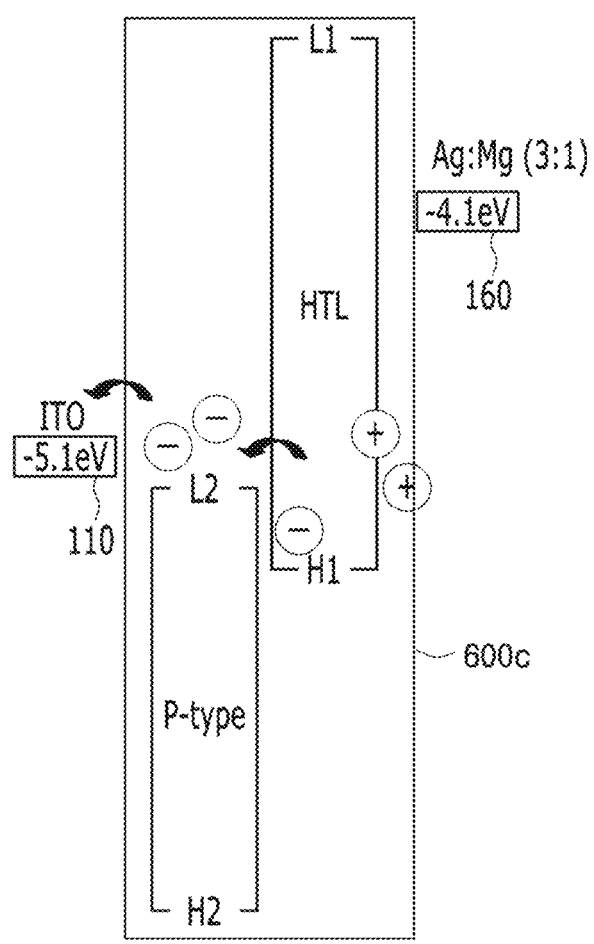

NA1

AA

NA3

LIGHT EMITTING DISPLAY DEVICE INCLUDING CONDUCTIVITY IMPROVEMENT LAYER

CROSS-REFERENCE TO RELATED APPLICATION

This application claims the priority benefit of Korean Patent Application No. 10-2018-0173122, filed on Dec. 28, 2018 in the Republic of Korea, which is hereby incorporated by reference as if fully set forth herein.

BACKGROUND OF THE INVENTION

Field of the Invention

The present invention relates to a light emitting display device, and more particularly, to a light emitting display device which changes a configuration of common layers to prevent light leakage generated around edge areas and a method for manufacturing the same.

Discussion of the Related Art

As we have recently entered the information age, the field of displays which visually display electrical information signals has been rapidly developed and, in order to satisfy such development, various flat display devices having excellent performance, such as thinness, light weight and low power consumption, are being developed and rapidly replacing conventional cathode ray tube (CRT) display devices.

As examples of such flat display devices, there are a liquid crystal display (LCD) device, a plasma display panel (PDP) device, a field emission display (FED) device, an organic light emitting diode (OLED) display device, a quantum dot display device, etc.

Among these devices, self-luminous display devices which do not require separate light sources and achieve compactness and clear color display, such as an organic light emitting diode display device and a quantum dot display device, are considered to have competitive applications.

Such a self-luminous display device includes a light emitting device having an anode and a cathode which are opposite to each other, a light emitting layer provided between the anode and the cathode, a common layer related to transporting of holes and provided between the anode and the light emitting layer, and a common layer related to transporting of electrons and provided between the cathode and the light emitting layer, in each of subpixels provided on a substrate. Here, the common layers are provided to raise luminous efficiency of the light emitting layer, and each common layer can have a multilayered structure rather than a monolayered structure between the corresponding electrode and the light emitting layer.

The common layers are formed using a common mask configured to cover the entirety of an active area, and are shared by all the subpixels in the active area. Further, in edge areas outside the active area, the common layer which is farthest from the cathode, which is located at the uppermost position, in the vertical direction is located at a position closest to the active area, and the upper common layers are configured to cover the lower common layers thereof. The reason for this is that, since the common layer far from the cathode, for example, the hole-transporting common layer, has a high resistance component, and causes resistance and lowers transport of electrons when it contacts the cathode, the hole-transporting common layer is formed at an inward region so as to avoid direct contact with the cathode.

For example, if a spacing region between the cathode and the edge of the hole-transporting common layer is not sufficient, the hole-transporting common layer is exposed to the outside in the edge areas, when the electron-transporting common layer is formed after the formation of the hole-transporting common layer. Here, the formed cathode contacts the hole-transporting common layer, resistance at a region of the hole-transporting common layer directly contacting the cathode is increased, and thus heating or abnormal light emission in the active area adjacent to the edge areas can be caused.

Therefore, the common layers disposed in the edge areas are formed such that respective areas thereof are gradually increased in a vertically upward direction.

However, if the respective common layers are formed to be spaced apart from each other in the edge areas, when the number of the common layers is increased, a margin area to provide a space between the common layers is increased and, in this case, an effective area actually used to display an image in the display device can be reduced.

SUMMARY OF THE INVENTION

Accordingly, the present invention is directed to a light emitting display device and a method for manufacturing the same that substantially obviate one or more problems due to limitations and disadvantages of the related art.

An object of the present invention is to provide a light emitting display device which changes a configuration of common layers disposed in edge areas to satisfy structural characteristics of a narrow bezel and to avoid contact between the common layer having high resistance and an electrode so as to prevent failure generated around the edge areas and thus to improve visibility, and a method for manufacturing the same.

Additional advantages, objects, and features of the invention will be set forth in part in the description which follows and in part will become apparent to those having ordinary skill in the art upon examination of the following or can be learned from practice of the invention. The objectives and other advantages of the invention can be realized and attained by the structure particularly pointed out in the written description and claims hereof as well as the appended drawings.

To achieve these objects and other advantages and in accordance with the purpose of the invention, as embodied and broadly described herein, a light emitting display device includes a substrate having an active area and edge areas around the active area, a plurality of subpixels in the active area, an organic light emitting diode including a first electrode, a first common layer, a light emitting layer, a second common layer and a second electrode stacked at each subpixel, a first common layer extension configured to extend from the first common layer in the edge areas, a conductivity improvement layer configured to contact an upper surface of the first common layer extension, in the edge area located on at least one side of the substrate, and a second electrode extension configured to extend from the second electrode and to overlap the conductivity improvement layer, and provided to be closer to the edges of the edge areas than the conductivity improvement layer.

The conductivity improvement layer can be provided in the edge areas located at a first side and a second side of the substrate, opposite to each other.

The conductivity improvement layer can include a p-type dopant in a first common layer forming material.

Positions of the p-type dopant in the conductivity improvement layers provided in the edge areas located at the first and second sides of the substrate can be vertically different.

The first common layer extension can directly contact another common layer extension between the first side and the second side of the substrate.

The conductivity improvement layer can lower sheet resistance of the first common layer extension located below the second electrode extension in a vertical direction.

The first common layer in the active area can have a greater thickness than that of the first common layer extension in the edge area located on at least one side of the substrate.

The conductivity improvement layer can be spaced apart from the active area.

The light emitting display device can further include a second common layer extension configured to extend from the second common layer and provided in the edge areas.

The second common layer extension can contact an upper surface of the conductivity improvement layer.

A lower surface of the second common layer extension can contact upper and side surfaces of the second common layer extension.

The conductivity improvement layer can protrude closer to the outermost edge of the edge area than the second common layer extension.

A lower surface of the second electrode extension can contact upper and side surfaces of the second common layer extension and upper and side surfaces of the first common layer extension protruding from the second common layer extension close to the outermost edge of the edge areas.

The second common layer and the second common layer extension can include electron-transporting or electron-injecting organic matter as a main component, and the first common layer and the first common layer extension can include hole-transporting organic matter as a main component.

The light emitting display device can further include a hole-injecting dummy layer contacting lower surfaces of the first common layer and the first common layer extension.

The conductivity improvement layer and the hole-injecting dummy layer can include the same material.

The second common layer and the second common layer extension can include a plurality of layers, and the second electrode extension in the edge areas can be located closer to the outermost edges of the edge areas than the respective layers of the second common layer extension.

In another aspect of the present invention, a method for manufacturing a light emitting display device includes preparing a substrate having an active area and edge areas around the active area, forming a first electrode in each of a plurality of subpixels in the active area, forming a first common layer configured to cover the entirety of the active area and to have a first process margin in the edge areas outside the active area, and forming a conductivity improvement layer on the first common layer in the edge areas, forming a light emitting layer in each of the subpixels, forming a second common layer having a large size than a size of the active area, on the light emitting layer, and forming a second electrode having a second process margin in the edge areas to cover at least the first common layer, on the second common layer.

The second process margin can be outside the first process margin, and an edge of the second common layer extension can be inside the first process margin or the second process margin.

The forming the first common layer and the forming the conductivity improvement layer can be carried out in the same chamber, a first common layer material deposition source and p-type dopant material deposition sources can be disposed adjacent to one another, and closing the p-type dopant material deposition sources, when the active area of the substrate corresponds to the p-type dopant material deposition sources, and opening the p-type dopant material deposition sources to supply a p-type dopant, when a first edge area of the substrate corresponds to the p-type dopant material deposition sources.

The p-type dopant material deposition sources can include a first p-type dopant material deposition source and a second p-type dopant material deposition source disposed at both sides of the first common layer material deposition source, and the supply of the p-type dopant can be carried out corresponding to first common layer material supply starting part and ending part of the substrate from the first common layer material deposition source.

The method can further include forming a hole-injecting dummy layer in the chamber, just before the forming the first common layer.

The forming the hole-injecting dummy layer can include depositing the hole-injecting dummy layer just before the forming the first common layer by opening a hole-injecting material deposition source, disposed adjacent to the first common layer material deposition source configured to supply a first common layer material in the chamber, before the active area of the substrate corresponds to the first common layer deposition source.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with descriptions to explain the principle of the invention. In the drawings:

FIGS. 10A to 10C are band diagrams of the light emitting display devices in accordance with the first to third test examples.

DETAILED DESCRIPTION OF THE EMBODIMENTS

Figure 1A:
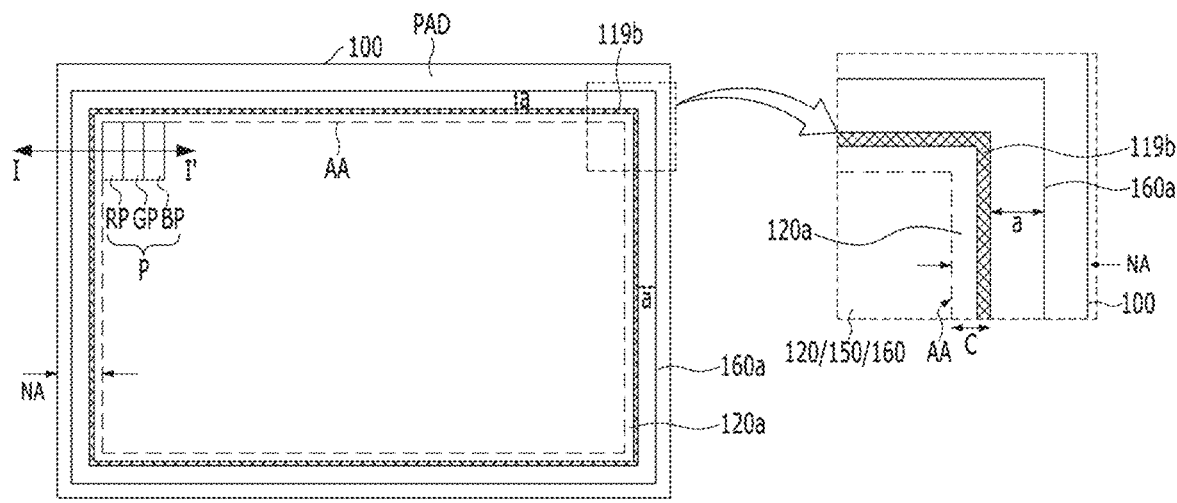
FIG. 1A is a plan view of a light emitting display device in accordance with a first embodiment of the present invention.

Reference will now be made in detail to the preferred embodiments of the present invention, examples of which are illustrated in the accompanying drawings. However, the present invention can be embodied in many alternative forms and should not be construed as limited to the embodiments set forth herein, and the embodiments of the present invention are provided only to completely disclose the invention and to completely inform those skilled in the art of the scope of the invention. Further, the names of elements used in the following description of the embodiments of the present invention are selected in consideration of ease in preparation of the specification, and can thus differ from the names of parts of an actual product.

Shapes, sizes, rates, angles, numbers, etc. disclosed in the drawings to describe the embodiments of the present invention are only exemplary and do not limit the present invention. In the following description of the embodiments and the drawings, the same or similar elements are denoted by the same reference numerals even though they are depicted in different drawings. In the following description of the embodiments of the present invention, a detailed description of known functions and configurations incorporated herein will be omitted when it can make the subject matter of the present invention rather unclear. In the following description of the embodiments, the terms 'including', 'having', 'consisting of', etc., will be interpreted as indicating presence of one or more other characteristics, numbers, steps, operations, elements or parts stated in the specification or combinations thereof, and do not exclude presence of characteristics, numbers, steps, operations, elements, parts or combinations thereof, or possibility of adding the same, unless the term 'only' is used. It will be understood that a singular expression of an element includes a plural expression of the element unless stated otherwise.

In interpretation of elements included in the various embodiments of the present invention, it will be interpreted that the elements include error ranges even if there is no clear statement.

In the following description of the embodiments, it will be understood that, when positional relations are expressed, for example, when an element is 'on', 'above', 'under', 'beside', etc., another element, the two elements can directly contact each other, or one or more other elements can be interposed between the two elements unless the term 'just' or 'directly' is used.

In the following description of the embodiments, it will be understood that, when temporal relations are expressed, for example, a term expressing a sequence of events, such as 'after', 'subsequent to', 'next to' or 'before' can encompass continuous relationship between the events, or discontinuous relationship between the events unless the term 'just' or 'directly' is used.

In the following description of the embodiments, it will be understood that, when the terms 'first', 'second', etc. are used to describe various elements, these terms are used merely to discriminate the same or similar elements. Therefore, an element modified by the term 'first' can be the same as an element modified by the term 'second' within the technical scope of the invention unless stated otherwise.

Characteristics of the various embodiments of the present invention can be partially or entirely connected to or combined with each other and technically variously driven and interlocked with each other, and the various embodiments can be independently implemented or be implemented together in connection with each other.

A light emitting display device in accordance with one or more examples of the present invention is a self-luminous display device, which includes a light emitting device (light emitting diode) performing light emission in each of a plurality of subpixels on a substrate, for example, an organic light emitting diode display device or a quantum dot display device.

Although the accompanying drawings exemplarily illustrate an organic light emitting diode display device as the light emitting display device, a quantum dot light emitting display device can be implemented by substituting a quantum dot light emitting layer for a light emitting layer of the organic light emitting diode display device and including the same stack structure and conductivity improvement layer as the organic light emitting diode display device.

Hereinafter, the light emitting display device in accordance with one or embodiments of the present invention will be described with reference to the accompanying drawings. All the components of the light emitting display device according to all embodiments of the present invention are operatively coupled and configured.

Figure 1B:
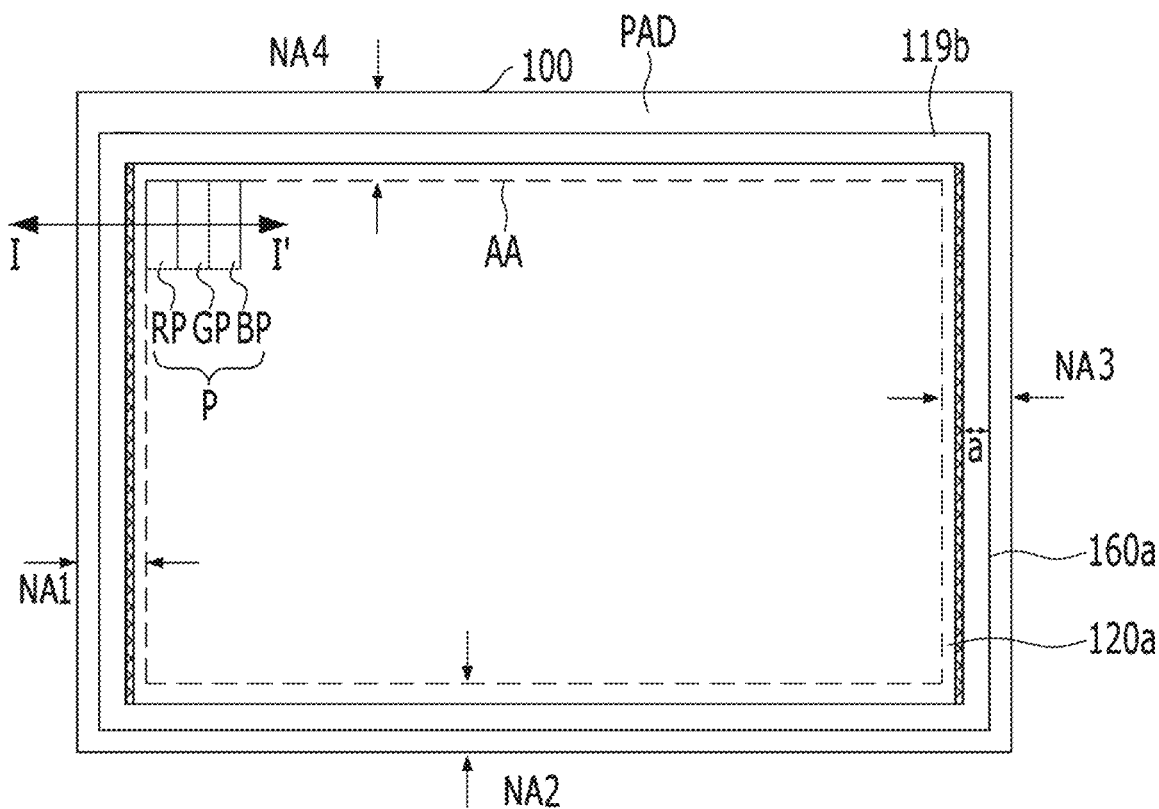
FIG. 1B is a plan view of a light emitting display device in accordance with a modification of the first embodiment of the present invention.
Figure 2:
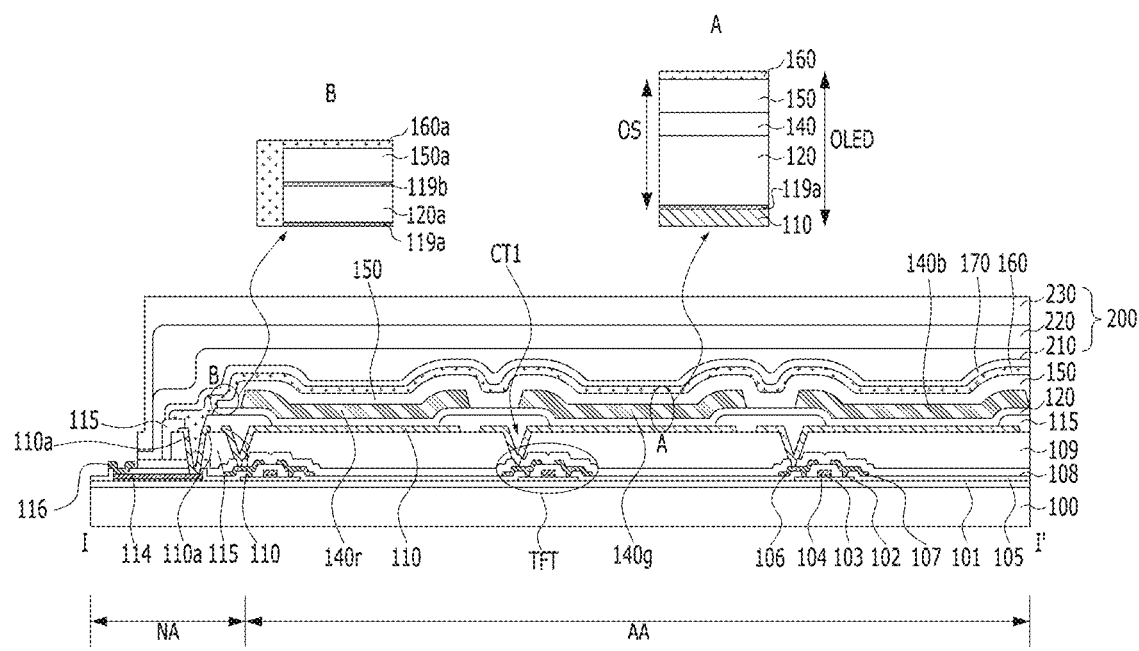
FIG. 2 is a cross-sectional view taken along line I-I' of one of FIGS. 1A and 1B.

FIG. 1A is a plan view of a light emitting display device in accordance with a first embodiment of the present invention, FIG. 1B is a plan view of a light emitting display device in accordance with a modification of the first embodiment of the present invention, and FIG. 2 is a cross-sectional view taken along line I-I' of one of FIGS. 1A and 1B.

As exemplarily shown in FIGS. 1A to 2, the light emitting display device in accordance with an example of the present invention includes a substrate 100 having an active area AA (an area inside a dotted line) and edge areas NA around the active area AA (an area outside the dotted line), a plurality of subpixels RP, GP and BP provided in the active area AA, each subpixel having an organic light emitting diode OLED (e.g., shown on the right side of FIG. 3) formed by stacking a first electrode 110, a first common layer 120, a light emitting layer 140: 140r, 140g or 140b, a second common layer 150 and a second electrode 160, a first common layer extension 120a extending from the first common layer 120 to be provided in the edge areas NA, a conductivity improvement layer 119b provided on the first common layer extension 120a, and a second electrode extension 160a extending from the second electrode 160 to be provided in the edge areas NA and to overlap the conductivity improvement layer 119b and located to be closer to the edges of the edge areas NA than the conductivity improvement layer 119b (referring to FIG. 2).

Further, in the following description of the embodiments of the present invention, the 'edge areas NA' preferably can mean areas around the active area NA, which are shielded by other parts or devices and are provided at the edges of the substrate 100 to have a designated width, and some of extensions of the elements of the organic light emitting diode OLED or wirings are disposed in the edge areas NA. The edge areas NA are not used in display and can thus also be referred to as non-display areas NA.

In the light emitting display device in accordance with one or more embodiments of the present invention, particularly as exemplarily shown in FIGS. 1A and 2, by providing the conductivity improvement layer 119b on the first common layer extension 120a in the edge areas NA, the second common layer(s) 150 formed after formation of the first common layer 120 and the first common layer extension 120a can have no process margin or a minimal process margin so that exposure of the first common layer extension 120a in the edge areas NA is prevented in formation of the second common layer(s) 150, and even if a second common layer extension 150a is formed farther inward than the first common layer extension 120a, the conductivity improvement layer 119b and the second electrode extension 160a are connected and thus direct contact between the second electrode extension 160a and the first common layer extension 120a having high resistance is prevented.

In the description of the embodiments of the present invention, 'process margin' can preferably mean a width of a corresponding layer to be formed which protrudes farther outward than a lower layer provided thereunder.

In the present invention, the first common layer extension 120a, the second common layer extension 150a and the second electrode extension 160a are provided in the edge areas NA which do not actually contribute to light emission and are thus referred to as extensions, and the first common layer extension 120a, the second common layer extension 150a and the second electrode extension 160a respectively extend integrally from the first common layer 120, the second common layer 150 and the second electrode 160.

As the size of the edge areas NA is increased, an ineffective area which does not contribute to display is increased, and thus, research on decrease in the size of the edge areas NA is underway in terms of increase in the effective area in the light emitting display device.

In the light emitting display device, when the light emitting diode including the stack of the first and second electrodes disposed opposite to each other, the common layers and the emitting layers provided between the first and second electrodes is formed, different masks are applied to formation of respective layers and process margins are applied to the respective layers in consideration alignment errors between the layers. Provisions of such process margins is an obstacle to reduction in the above-described ineffective area, and thus the light emitting display device in accordance with the present invention changes a configuration of the edge areas so as to reduce the process margins, and generates no failure even if an alignment error between the layers occurs.

In general, common layers in a light emitting display device are layers which are formed in common so as to cover the entirety of an active area. In a light emitting display device in accordance with a comparative example and known light emitting display devices, common layers are formed to have different process margins, respectively, and are configured such that areas of the respective common layers are gradually increased in an upward direction and thus an upper common layer and a second electrode cover a lower common layer. However, in this case, when the respective common layers have the different process margins, an area occupied by the process margins in the edge areas is increased, and thereby an ineffective area is increased. Therefore, the light emitting display device in accordance with the present invention further includes the conductivity improvement layer 119b in the edge areas, thus having a configurational difference with the light emitting display device in accordance with the comparative example.

The first common layer extension 120a overlaps the edge area NA by a first interval c from the edge of the active area AA. The first interval c is a value in consideration of an alignment error when a deposition mask and a deposition source are aligned to form the first common layer 120, and the first interval c has a small value when the alignment error is small and has a large value when the alignment error is large. For example, if the light emitting display device is a small terminal, such as a mobile terminal, a smart watch or an e-book, the first interval c can be about 100 μm or less.

The first common layer 120 is a hole transport related common layer, and the second common layer 150 is an electron transport related common layer. Each of these common layers 120 and 150 can have a multilayered structure from the point of view of efficiency improvement and lifespan improvement. In most cases, other than a hole-transporting layer and an electron-transporting layer, layers subsidiarity assisting efficiency improvement and lifespan improvement have smaller thicknesses that those of the hole-transporting layer and the electron-transporting layer.

Through the first common layer extension 120a, if an alignment error of a designated value occurs during formation of the hole-transporting first common layer 120 in the respective light emitting diodes in the active area AA, the first common layer 120 can sufficiently cover the active area AA even though a shift in a leftward or rightward direction or in an upward or downward direction occurs. In a subpixel in which the hole-transporting first common layer 120 is not provided between the first electrode and the second electrode of the light emitting diode, hole transport is not normally carried out, and thus recombination of electrons and holes in the corresponding light emitting layer is not effectively carried out due to delay of hole transport, or the like. Therefore, the first common layer extension 120a which is formed integrally with the first common layer 120 is provided to have the first interval c, in consideration of the process margin thereof corresponding to the edge areas NA in design.

In the light emitting display device in accordance with one or more embodiments of the present invention, the conductivity improvement layer 119b is provided to directly contact the upper surface of the first common layer extension 120a. The conductivity improvement layer 119b can be formed of a material having resistance lower than at least one of the first common layer 120 and the first common layer extension 120a, be formed on the upper surface of the first common layer extension 120a during the same process as formation of the first common layer 120 and the first common layer extension 120a, and have a shape surrounding the edge of the first common layer extension 120a, as exemplarily shown in FIG. 1A. Otherwise, although the conductivity improvement layer 119b can be formed on the entire area of the first common layer extension 120a in the edge areas NA, the conductivity improvement layer 119b can be restrictively formed on some regions of the area of the first common layer extension 120a. Here, if the edge areas NA include first to fourth edge areas NA1, NA2, NA3 and NA4 located at left, lower, right and upper sides of the substrate 100 based on the active area AA, the conductivity improvement layer 119b can be located in the first and third edge areas NA1 and NA3. Therefore, the conductivity improvement layer 119b can have discontinuities in the formation region thereof.

In this case, the conductivity improvement layer 119b can be formed within a region where the first common layer extension 120a is located, i.e., within the first interval c, so as to equivalent to efficiency of the light emitting diodes in the active area without change in the stack structure of the light emitting diodes.

Although the target of the conductivity improvement layer 119b is to be formed within the first interval c, as circumstances require, as deposition is performed while moving a deposition sources or the substrate 100, a material for the conductivity improvement layer 119b can remain to have a smaller thickness than the thickness of the conductivity improvement layer 119b in some regions of the active area AA adjacent to the edge areas NA due to continuity of deposition. The conductivity improvement layer 119b is formed to have a small thickness of about 30 Å or less, corresponding to ⅒ to ¹⁄₆₀₀ of the thickness of the first common layer 120, and does not significantly influence the function of the light emitting diodes in the remaining active area AA.

The first interval is smaller than the width of the edge areas NA, and the edge of the common layer extension 120a is located farther inward than the edge of the substrate 100 and is spaced apart from the edge of the substrate 100. This means that elements to cover the upper surface of the first common layer extension 120a are provided outside the first common layer extension 120a in the edge areas NA and, for example, these elements can be the second electrode 160, a capping layer 170 and an encapsulation part 200.

In the light emitting display device in accordance with one or more embodiments of the present invention, the second common layer 150 is formed in the active area AA after formation of the light emitting layers 140: 140r, 140g and 140b. When the second common layer 150 is formed, the second common layer extension 150a formed integrally with the second common layer 150 can be provided in the edge areas NA. In the light emitting display device in accordance with the comparative example, a second common layer is formed to have a large process margin so that the second common layer has a greater size than a first common layer so as to avoid direct contact between the first common layer and a second electrode, but, in the light emitting display device in accordance with the present invention, the second common layer extension 150a can be formed to have a size similar to or less than that of the first common layer extension 120a. In the latter case, even if the first common layer extension 120a is exposed farther outward than the second common layer extension 150a and thus the second electrode 160 and the conductivity improvement layer 119b directly contact each other, sheet resistance of the second electrode 160 is not increased due to the conductivity improvement layer 119b which surrounds the active area AA along the edge line of the first common layer extension 120a and is in area contact with the first common layer extension 120a. Further, the conductivity improvement layer 119b steals electrons from the first common layer extension 120a provided thereunder due to electron withdrawing characteristics of the conductivity improvement layer 119b, and thereby, the first common layer extension 120a and the first common layer 120 formed integrally therewith lack electrons, holes are generated in electron vacancies, and carrier mobility to the light emitting layers 140 of the light emitting diodes in the active area AA and conductivity of the light emitting diodes are improved.

As exemplarily shown in FIG. 2, a hole-injecting dummy layer 119a can be further formed under the hole-transporting first common layer 120 and first common layer extension 120a. The hole-injecting dummy layer 119a can be formed as a separate layer independently of the first common layer 120 and the first common layer extension 120a to be provided thereunder, or be formed by doping a hole-transporting material of the lower portions of the first common layer 120 and the first common layer extension 120a with about 1-20 wt % of a hole-injecting material. Here, the lower portions of the first common layer 120 and the first common layer extension 120 can be portions thereof corresponding to less than ½ of the total thickness of the first common layer extension 120a, and particularly, be portions thereof corresponding to ⅕ or less to ¹⁄₂₀ or less of the total thickness of the first common layer extension 120a. The hole-injecting dummy layer 119a and the conductivity improvement layer 119b are formed before and after formation of the first common layer 120 and the first common layer extension 120a, using the same mask in the same chamber as formation of the first common layer 120 and the first common layer extension 120a, and are formed by doping a material to form the first common layer 120 with a conductivity improving material having lower resistance than the first common layer 120. For example, the conductivity improving material can be a p-type dopant. As circumstances require, the conductivity improvement layer 119b can be formed of a material for the conductivity improvement layer 119b having excellent p-type characteristics which is more effective to improve conductivity, which is different from a material for the hole-transporting dummy layer 119a. In the latter case, the conductivity improvement layer 119b having a different material composition from that of the hole-injecting dummy layer 119a can be formed using a conductivity improving material deposition source to form the conductivity improvement layer 119b which is separately provided. The hole-injecting dummy layer 119a contacts the lower surfaces of the first common layer extension 120a and the first common layer 120, and the conductivity improvement layer 119b contacts the upper surface of the first common layer extension 120a. As circumstances require, the hole-injecting dummy layer 119a is not provided as a separate layer, and can be included in the lower portions of the first common layer 120 and the first common layer extension 120a by co-depositing the hole-transporting material and the hole-injecting material at an initial stage of formation of the first common layer 120 and the first common layer extension 120a. Further, if the hole-injecting dummy layer 119a is omitted, as such, the hole-injecting material can function as a kind of dopant included in the first common layer 120.

The first common layer 120 in the active area AA, on which the conductivity improvement layer 119b is not formed (referring to region A of FIG. 2), is formed by blocking supply of the conductivity improving material and continuously supplying the hole-transporting material, and can have a greater thickness than that of the first common layer extension 120a (referring to region B of FIG. 2) in the edge areas NA.

The second common layer extension 150a formed in the edge areas NA integrally with the second common layer 150 formed after formation of the light emitting layers 140: 140r, 140g and 140b can have a smaller area than that of the first common layer extension 120a, and in severe cases, no second common layer extension 150a can be provided in the edge areas NA. That is, the second common layer extension 150a in accordance with the present invention can have no process margin so as not to protrude outward from the first common layer extension 120a. Therefore, the second electrode extension 160a formed integrally with the second electrode 160, which is the uppermost element of the light emitting diode, can be connected to the upper and side surfaces of the first common layer extension 120a protruding farther outward than the second common layer extension 150a (with reference to FIG. 4B).

The second electrode 160 is also formed to cover the entirety of the active area AA and the second electrode extension 160a protrudes to the edge areas NA, in the same manner as the first and second common layer extensions 120a and 150a, and receives an electrical signal through signal connection lines 114 in a thin film transistor array provided under the edge areas NA. The signal connection lines 114 are connected to pad electrodes 116, and the pad electrodes 116 at the edges of the edge areas NA are exposed and connected to a printed circuit board (PCB) or a flexible printed circuit board (FPCB).

The pad electrodes 116 can be located at any one side of the substrate 100. In addition to the pad electrodes 116 to transmit a signal to the second electrode 160, a plurality of pad electrodes used to transmit a signal to wirings of the thin film transistor array can be further provided. For convenience in connection to the printed circuit board (PCB) or the flexible printed circuit board (FPCB), these pad electrodes can be configured to be adjacent to each other. A region in which the pad electrodes are provided to be adjacent to each other in the edge areas NA of the substrate 100 is referred to as a pad part PAD.

The substrate 100 can have a rectangular shape, as exemplarily shown in FIGS. 1A and 1B, or have an atypical shape, such as an asymmetrical shape or a partially curved shape, as needed. The light emitting display device in accordance with the present invention can be defined on the substrate 100 having any shape, and be characterized in that the conductivity improvement layer 119b is formed on the upper surface of the first common layer extension 120a in the edge areas NA of the substrate 100. The conductivity improvement layer 119b can be formed at all edges of the substrate 100, as exemplarily shown in FIG. 1A, or be formed at both side edges of the substrate 100, as exemplarily shown in FIG. 1B.

The first common layer 120 and the first common layer extension 120a can be integrally formed of the same material, i.e., the hole-transporting material, for example, one or more selected from the group consisting of N,N'-bis(naphthalene-1-yl)-N,N'-bis(phenyl)-2,2'-dimethylbenzidine (NPD), N,N'-bis-(3-methylphenyl)-N,N'-bis-(phenyl)-benzidine (TPD) and (2,2'7,7'tetrakis(N,N-diphenylamino)-9,9'-spirofluorene (Spiro-TAD). However, since one of the main objects of the first common layer 120 and the first common layer extension 120a is to have a hole transporting function, the first common layer 120 and the first common layer extension 120a are not limited to the above-described materials and can be formed of any hole-transporting organic material.

As the material to form the conductivity improvement layer 119b, a material having lower resistance than that of the first common layer 120 and the first common layer extension 120a can be included as a dopant in the material for the first common layer 120, and can be, for example, a p-type dopant or an organic material having high conductivity, which can lower resistance of an electrode contacting the same.

For example, the organic material having high conductivity to form the conductivity improvement layer 119b can be one of p-type dopants expressed as chemical formulas 1 to 4.

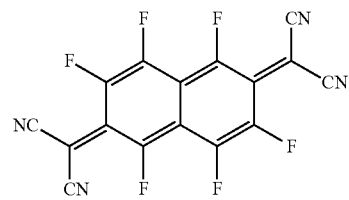

[Chemical formula 1]

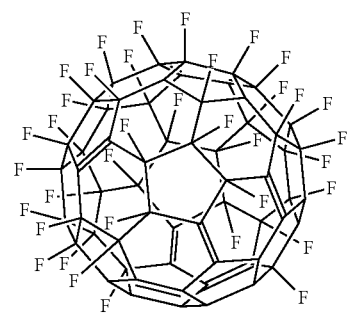

[Chemical formula 2]

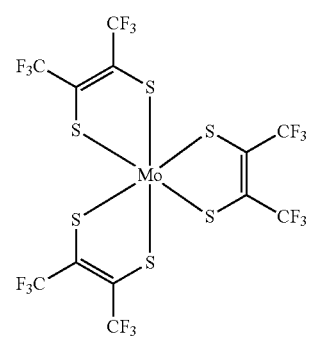

[Chemical formula 3]

[Chemical formula 4]

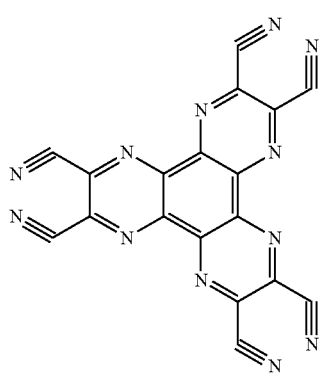

However, in addition to the materials expressed as chemical formulas 1 to 4, the conductivity improvement layer 119b can be formed of any material which can have lower resistance than the hole-transporting material to form the first common layer 120 and excellent conformability with the first common layer 120 and can lower resistance of a layer connected thereto.

The first common layer 120 can include a hole injection layer, a hole transport layer, an electron blocking layer, etc. The first common layer 120 essentially includes the hole transport layer, and can further include additional layers having other characteristics. In the present invention, the first common layer 120 and the first common layer extension 120a have planar continuity without disconnection but have a thickness difference according to areas, and the first common layer 120 and the first common layer extension 120a are different in that the conductivity improvement layer 119b is further formed on the first common layer extension 120a located in the edge areas NA. For example, even if an additional hole transport-related layer, such as the electron blocking layer, is further formed on the hole transport layer, the conductivity improvement layer 119b can be further provided in selective areas, i.e., the edge areas NA, on the hole transport-related layer of the first common layer extension 120a formed integrally from the first common layer 120 in the active area AA without disconnection, and thus lower resistance of the hole transport-related layer.

The second common layer 150 and the second common layer extension 150a which are formed integrally can include a hole blocking layer, an electron transport layer, an electron injection layer, etc. The second common layer 150 and the second common layer extension 150a essentially include the electron transport layer, and can further include additional layers having other characteristics. Further, the second common layer 150 can be formed of, for example, an anthracene-based compound, and further include a dopant to adjust electron mobility and a barrier with an adjacent layer thereto, as needed.

Each of a plurality of subpixels provided in the active area AA includes an organic light emitting diode OLED, and the organic light emitting diode is formed by stacking the first electrode 110, the first common layer 120, the light emitting layer 140, the second common layer 150 and the second electrode 160. The respective subpixels can include the red light emitting layer 140r, the green light emitting layer 140g and the blue light emitting layer 140b according to colors of light emitted by the subpixels, as exemplarily shown in FIG. 2. Light emitting layers of other colors than the above-described colored light emitting layers 140r, 140g and 140b can be provided according to colors of light emitted by the subpixels. Since these light emitting layers 140r, 140g and 140b are formed using fine metal masks (FMM) provided with fine openings according to respective colors, the light emitting layers 140r, 140g and 140b can be selectively formed in the active area AA except for the edge areas NA, and do not have extensions in the edge areas NA and thus do not increase the edge areas NA.

As circumstances require, color filters can be further provided to divide colors of the respective subpixels instead of provision of different light emitting layers. Here, a color filter layer can be further provided on or under the light emitting diodes to be close to a light emitting side, and the light emitting diodes of the respective subpixels can include a white light emitting stack having the same configuration. In this case, the respective subpixels can include the same white light emitting layer, or include plural different colored light emitting stacks which are stacked so as to finally emit white light through the light emitting diodes. In any case, in the light emitting display device in accordance with the present invention, the conductivity improvement layer 119b is provided on the upper surface of the first common layer extension 120a which is initially formed, and thus, the second common layer 150 (and the common layer extension 150a) which is subsequently formed can have no process margin. Since process margins according to layers are provided in the edge areas NA, increase in the size of the edge areas NA can be prevented. Respective layers of such a white light emitting stack are formed in common in the active area AA using a common mask other than a fine metal mask, and, after formation of the hole-transporting first common layer 120 next to formation of the first electrode 110, the conductivity improvement layer 119b is formed and then, even if a plurality of light emitting layers is vertically provided, the light emitting layers are formed inside the first common layer extension 120a without process margins in the edge areas NA.

A bank 115 is provided among the subpixels RP, GP and BP, and can thus define regions in which light is emitted by the respective light emitting diodes, through openings thereof. A dam pattern formed of the same material as the bank 115 can be further provided in the edge areas NA and can thus prevent a material in a liquid state from overflowing the dam pattern during a manufacturing process.

Further, as exemplarily shown in FIG. 2, the substrate 100 can include the thin film transistor array provided between the substrate 100 and the organic light emitting diodes.

The thin film transistor array includes thin film transistors TFTs connected to the organic light emitting diodes OLEDs in the respective subpixels in the active area AA.

The thin film transistor TFT includes a semiconductor layer 102, a gate electrode 104 overlapping the semiconductor layer 102 to define a channel region, and a drain electrode 106 and a source electrode 107 connected to both sides of the semiconductor layers 102.

The semiconductor layer 102 can be formed of an amorphous silicon layer, a crystalline silicon layer or an oxide semiconductor layer, and, as circumstances require, two or three layers of the above-described layers can be stacked.

A gate insulating film 103 is provided between the gate electrode 104 and the semiconductor layer 102. Further, a buffer layer 101 to prevent effect of a process of removing elements from the lower surface of the substrate 100 or penetration of impurities from the substrate 100 can be further provided between the semiconductor layer 102 and the substrate 100. As circumstances require, the buffer layer 101 can be omitted.

Further, wirings, such as gate lines connected to the gate electrodes 104 and extending in one direction, data lines connected to the source electrodes 107 and disposed in a direction intersecting the gate lines, a power supply line, etc., can be further provided on the substrate 100.

The thin film transistor array in the edge areas NA can further include the signal connection lines 114 formed through the same process as formation of the gate electrodes 104, and the pad electrodes 116 connected to the signal connection lines 114 and formed through the same process as formation of the source electrodes 107 and the drain electrodes 106.

Here, reference numeral 105 indicates an interlayer insulating film, reference numeral 108 indicates an inorganic protective film, reference numeral 109 indicates an organic protective film, and these films 105, 108 and 109 are provided to insulate wirings of different layers in regions which are not connected.

Further, the organic light emitting diode OLED can further includes the capping layer 170 to protect the surface of the second electrode 160 and to improve light extraction. The capping layer 170 can be formed of a hole-transporting material of the same series as or a similar series to the first common layer 120 of the organic light emitting diode OLED, or be formed by stacking such a hole-transporting material and an inorganic material. Further, in order to improve light extraction, the stacked layers can have a designated refractive index difference.

Further, the encapsulation part 200 is provided on the upper surface of the capping layer 170 to cover the capping layer 170 so as to protect an array of the organic light emitting diodes OLEDs. The encapsulation part 20 essentially includes a first inorganic film 210, an organic film 220 and a second inorganic film 230, and can further include one or more pairs of a stack of an inorganic film and an organic film provided thereon. The first and second inorganic films 210 and 230 of the encapsulation part 200 protrude farther outward than the organic film 220 in the edge areas NA so as to directly meet outdoor air, and is thus effective in preventing transmission of external moisture.

The organic film 220 can have a greater thickness than any layer included in the thin film transistor array or the organic light emitting diode array, sufficient to prevent movement of particles generated in processes, and therefore, after formation of the organic film 220, the surface of the organic film 220 is planarized due to these characteristics. In order to exhibit such an effect, the organic film 220 can have a thickness which is 5 times to 20 times the thicknesses of the first and second inorganic films 210 and 230. The encapsulation part 200 including the first inorganic film 210, the organic film 220 and the second inorganic film 230 can be formed to expose the pad electrodes 116 at the side of the substrate 100 where the pad part PAD is located, and the first and second inorganic films 210 and 230 can be formed to the edges of the substrate 100 at other sides of the substrate 100 where the pad part PAD is not located.

The encapsulation part 200 extends to the edges of the substrate 100 in regions except for the pad part PAD, and is configured to expose the pad electrodes 116 in the pad part PAD so that the pad electrodes 116 can be connected to the printed circuit board after formation of the encapsulation part 200.

The substrate 100 can employ, for example, a hard glass substrate, a plastic substrate or a plastic film which is bendable.

Further, as exemplarily shown in FIGS. 1A and 1B, a set of a red subpixel RP, a green subpixel GP and a blue subpixel BP can constitute one pixel P. Such a pixel P is repeated into a matrix on the substrate 100 in the active area AA. Although the illustrated example represents the red, green and blue subpixels RP, GP and BP, the pixel P is not limited thereto and can include a combination of subpixels to emit other colors of light, such as yellow, magenta, cyan, etc. As circumstances require, in addition to the illustrated colored subpixels RP, GP and BP, the pixel can further include a white subpixel.

Division of the respective subpixels can be achieved according to colors of light emitted by the subpixels. Colors of emitted light can be acquired by varying the configuration of the light emitting layers in the organic light emitting diodes OLEDs, or by providing a color filter layer close to light emitting sides of the organic light emitting diodes OLEDs while emitting light of the same color through the organic light emitting diodes OLEDs. If the respective subpixels have different light emitting layers to emit different colors of light, the respective light emitting layers 140r, 140g and 140b are located to be spaced apart from one another, as exemplarily shown in FIG. 2.

Figure 3:
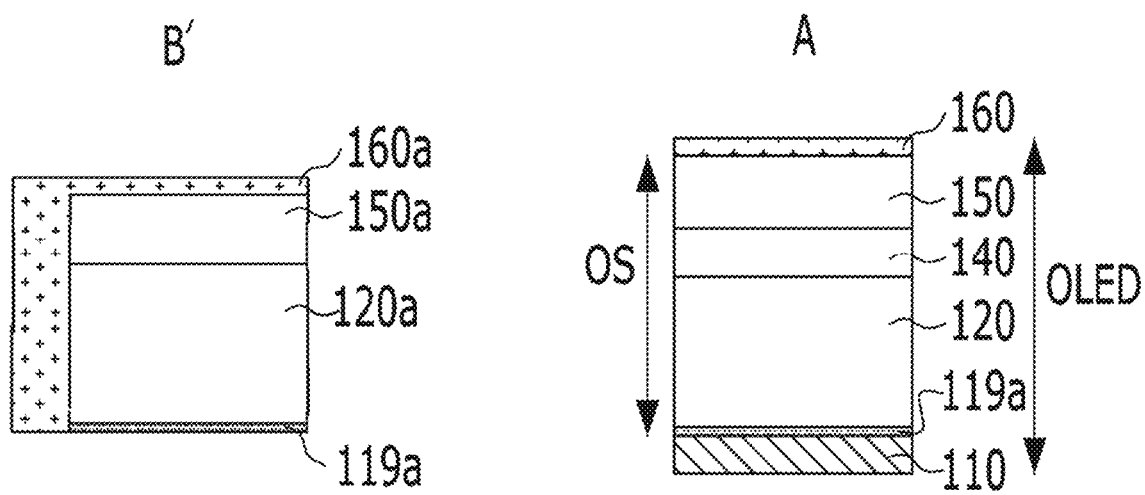
FIG. 3 shows cross-sectional views of an organic stack in an active area and an organic stack in edge areas at regions A and B of FIG. 2.

FIG. 3 shows cross-sectional views of an organic stack in the active area (A) and an organic stack in the second and fourth edge areas (B').

As exemplarily shown in FIG. 1B, if the conductivity improvement layer 119b is formed in the first and third edge areas NA1 and NA3 and is not formed in the second and fourth edge areas NA2 and NA4, organic stacks in the two edge areas have different structures (referring to B of FIG. 2 and B' of FIG. 3). As exemplarily shown in B' of FIG. 3, during a process of forming the first common layer 120 after formation of the hole-injecting dummy layer 119a, in the second and fourth edge areas NA2 and NA4, the second common layer extension 150a is located directly on the first common layer extension 120a, and the second electrode extension 160a is located to cover the upper and side surfaces of the second common layer extension 150a and the side surface of the first common layer extension 120a. In this case, an organic stack B' in the second and fourth edge areas NA2 and NA4 has the same configuration of the common layers as an organic stack A in the active area AA except that the organic stack β' does not have the light emitting layer 140.

Hereinafter, the configuration of the edge areas of the above-described light emitting display device in accordance with the present invention will be described in more detail.

Figure 4A:
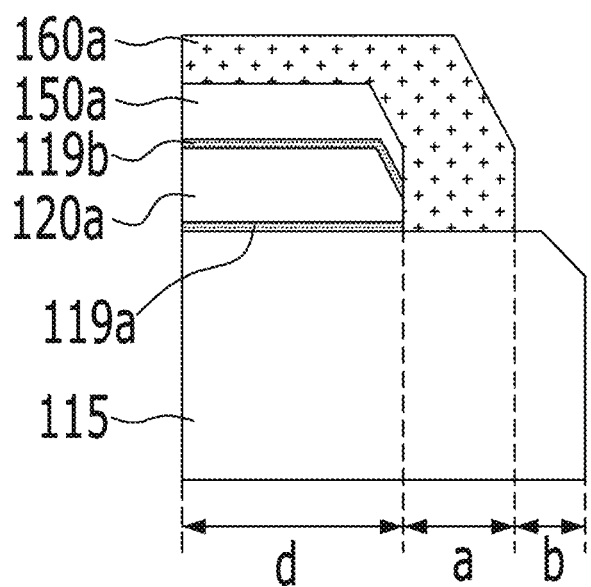
FIGS. 4A and 4B are cross-sectional views illustrating configurations of common layers in the edge areas of the light emitting display devices in accordance with the first embodiment of the present invention and the modification thereof.
Figure 4B:
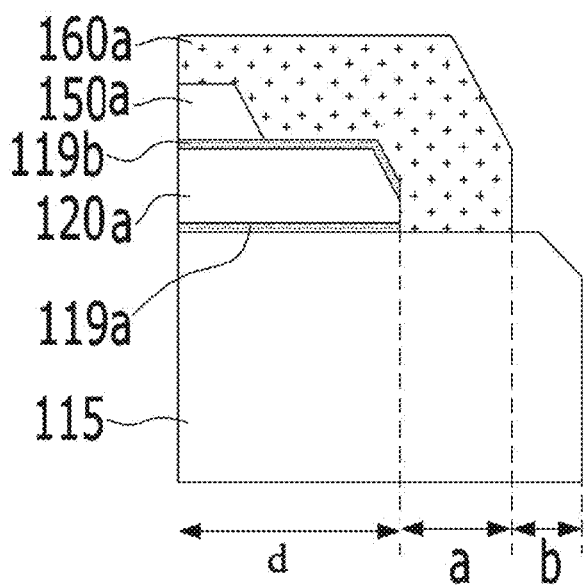

FIGS. 4A and 4B are cross-sectional views illustrating configurations of common layers in edge areas of the light emitting display devices in accordance with the first embodiment of the present invention and the modification thereof.

As exemplarily shown in FIG. 4A, in the light emitting display device in accordance with the first embodiment of the present invention, the hole-transporting dummy layer 119a, the first common layer extension 120a, the conductivity improvement layer 119b, the second common layer extension 150a and the second electrode extension 160a are sequentially located on the bank 115 in the edge areas NA. Here, since the hole-injecting dummy layer 119a, the first common layer extension 120a, and the conductivity improvement layer 119b can be formed using the same mask in the same chamber, the edges thereof can coincide with one another.

Further, the second common layer extension 150a can be formed without a process margin, and have the same width as the first common layer extension 120a, as exemplarily shown in FIG. 4A, or can be formed farther inward than the first common layer extension 120a, as exemplarily shown in FIG. 4B. If interlayer misalignment is severe, the second common layer extension 150a may not be provided in the edge areas NA and, in this case, the conductivity improvement layer 119b protruding farther outward than the second common layer extension 150a meets the second electrode extension 160a, prevents increase in resistance of the second electrode 160 and thus prevents lowering of luminance according to respective regions.

A width of an overlapping region between the first common layer extension 120a and the conductivity improvement layer 119b is referred to as a first width d, and the first width d is included in the first interval c (referring to FIG. 1) in the edge areas NA, occupied by the first common layer extension 120a. If the first width d is greatest, the conductivity improvement layer 119b can be formed to occupy the entirety of the first interval corresponding to the width of the first common layer extension 120a.

The second electrode extension 160a is formed to protrude farther outward than the first common layer extension 120a by a second interval a so as to cover all the side surfaces of the second common layer extension 150a, the conductivity improvement layer 119b, the first common layer extension 120a and the hole-injecting dummy layer 119a. The light emitting display device can further include protrusions connected to the signal connection lines 114 located under the pad part PAD. Although not shown in the drawings, contact holes can be provided in some regions in which the second electrode extension 160a and the bank 115 overlap, and connection with wirings located under the second electrode extension 160a and the bank 150 to transmit ground voltage or phase voltage can be carried out through the contact holes. Here, the wirings to transmit ground voltage or phase voltage can be connected to pad electrodes disposed in the same layer as the wirings or in a different layer from the wirings.

In the light emitting display device in accordance with the present invention, since common layers formed after formation of the conductivity improvement layer 119b can be formed without process margins, when the organic light emitting diodes OLEDs are formed, only the first interval c of the first common layer extension 120a and the second interval a of the second common layer extension 160a are provided as extensions in the edge areas NA, and thus the width of the edge areas NA can be remarkably reduced, as compared to the light emitting display device in accordance with the comparative example, in which respective common layers are configured to gradually protrude farther outward than the lower layers thereof in the edge areas.

Although FIGS. 4A and 4B illustrate the bank 115 as protruding from the second electrode extension 160a by a third interval b, this structure is not essential and the third interval b can be omitted, as circumstances require.

The conductivity improvement layer 119b contacts the upper surface of the first common layer extension 120a, and thus serves to avoid direct contact between the first common layer extension 120a having high resistance and other elements.

Further, the conductivity improvement layer 119b can be spaced apart from the active area AA. The conductivity improvement layer 119 is restrictively provided only in the edge areas NA, so as to prevent influence on driving of the organic light emitting diodes OLEDs.

If the second common layer extension 150a extending from the second common layer 150 is further provided in the edge areas NA, the second common layer extension 150a can contact the upper surface of the conductivity improvement layer 119b.

As exemplarily shown in FIG. 4A, the lower surface of the second electrode extension 160a can contact the upper and side surfaces of the second common layer extension 150a.

As exemplarily shown in FIG. 4B, the conductivity improvement layer 119b can protrude to be closer to the edges of the edge areas NA than the second common layer extension 150a.

The lower surface of the second electrode extension 160a can contact the upper and side surfaces of the second common layer extension 150a and the upper and side surfaces of the first common layer extension 120a protruding from the second common layer extension 150a to be close to the edges of the edge areas NA.

The second common layer 150 and the second common layer extension 150a can include electron-transporting or electron-injecting organic matter as a main component, and the first common layer 120 and the first common layer extension 120a can include hole-transporting organic matter as a main component.

The conductivity improvement layer 119b can include the above-described p-type dopant as organic matter having a LUMO (Lowest Unoccupied Molecular Orbital) level which has a difference with a work function of the first electrode 110 by 1.5 eV or less. The p-type dopant can be an organic material.

The conductivity improvement layer 119b can lower sheet resistance of the first common layer extension 120a located in the vertical direction of the second electrode extension 160a.

The edge areas NA can further include the hole-injecting dummy layer 119a contacting the lower surface of the first common layer extension 120a, as exemplarily shown in FIG. 4A.

The conductivity improvement layer 119b and the hole-injecting dummy layer 119a can be formed of the same material, or a material of the hole-injecting dummy layer 119a can be selected from the point of view of stabilized interfacial properties with the first electrode 110 (referring to FIG. 2) and hole injection transmission, and a material of the conductivity improvement layer 119b can be selected from the point of view of location of the conductivity improvement layer 119b on the first common layer extension 120a outside the first common layer 120 and reduction in contact resistance with an element located thereon.

The second common layer 150 and the second common layer extension 150a include a plurality of layers, and the second electrode extension 160a in the edge areas NA is located closer to the edges of the edge areas NA than the respective layers of the second common layer extension 150a.

Figure 5A:
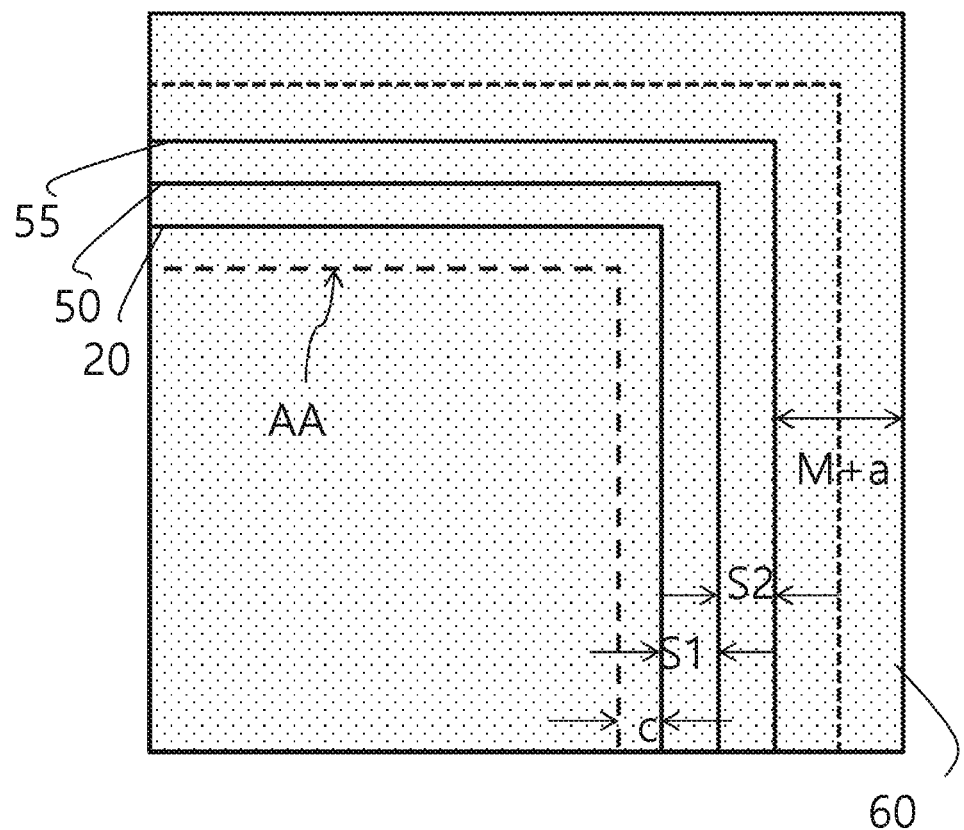
FIGS. 5A and 5B are respectively a plan view and a cross-sectional view illustrating edge areas of a light emitting display device in accordance with a comparative example.
Figure 5B:
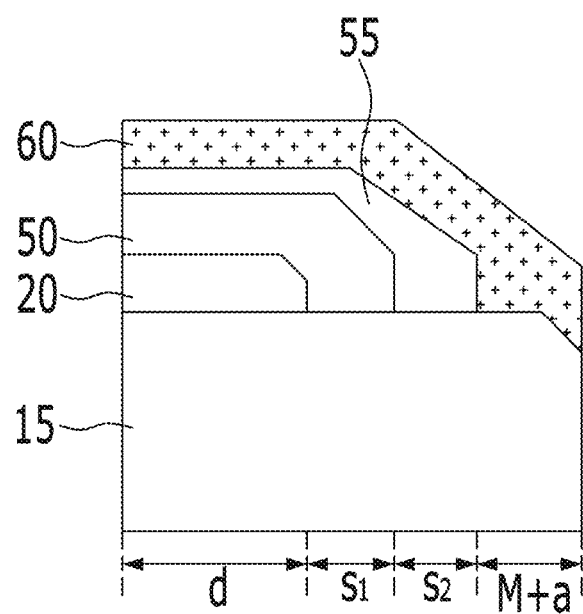

FIGS. 5A and 5B are respectively a plan view and a cross-sectional view illustrating the edge areas of the light emitting display device in accordance with the comparative example.

As exemplarily shown in FIGS. 5A and 5B, in the edge areas NA of the light emitting display device in accordance with the comparative example, common layers, i.e., a hole transport layer 20, a hole blocking layer 50, an electron transport layer 55 and a second electrode 60, are formed on a bank 15 such that widths thereof are gradually increased in the upward direction.

In the light emitting display device in accordance with the comparative example, the lower position a layer is located at, the higher resistance the layer has, and thus, when the lower layer contacts the second electrode 60, the resistance of the second electrode 60 is increased. In order to solve such a problem, the layers are stacked such that the widths thereof in the edge areas are gradually increased in the upward direction. That is, as exemplarily shown in FIG. 5A, the hole transport layer 20 has a first interval c, the hole blocking layer 50 and the electron transport layer 55 respectively have margins S1 and S2, a margin M in consideration of interlayer misalignment among these common layers is provided, and the second electrode has a second interval greater than the margin M.

As such, the light emitting display device in accordance with the comparative example requires intervals between common layer extensions in the edge areas, and thus the size of the edge areas is increased.

Further, if the respective common layers are formed regardless of these process margins, in severe cases, the hole transport layer 20 can contact the second electrode 60, and thereby, contact resistance of the second electrode 60 can be remarkably increased.

In Table 1, such an abnormal structure in which the hole transport layer 20 and the second electrode 60 contact in the edge areas due to interlayer warpage generated in processes of the light emitting display device in accordance with the comparative example will be compared to a normal structure. If the hole blocking layer 50 and the electron transport layer 55 do not have the margins S1 and S2 in the edge area or the edges of the hole blocking layer 50 and the electron transport layer 55 are located farther inward than the edge of the hole transport layer 20 due to a problem in interlayer alignment, the hole transport layer 20 contacts the second electrode 60 and thus causes increase in the resistance of the second electrode 60, and thereby driving voltage to drive an organic light emitting diode including the second electrode 60 is raised, as shown in Table 1. Further, contact between the hole transport layer 20 having high resistance and the second electrode 60 lowers luminance even at a high driving voltage.

TABLE 1

| Condition | Driving voltage (V) | Luminance (Cd/A) | Color coordinate CIEx | Color coordinate CIEy |
|---|---|---|---|---|
| Normal structure | 4.5 | 5.0 | 0.142 | 0.093 |
| Abnormal structure | 8.5 | 1.5 | 0.142 | 0.096 |

Figure 6A:
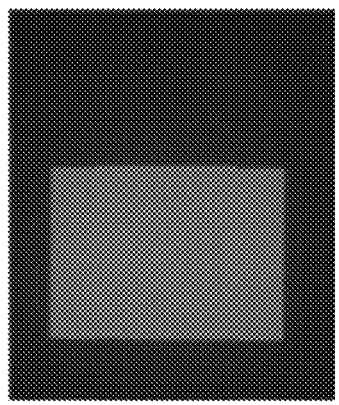
FIG. 6A is a photograph representing the light emitting display device in accordance with the comparative example in normal driving of blue light emitting diodes.
Figure 6B:
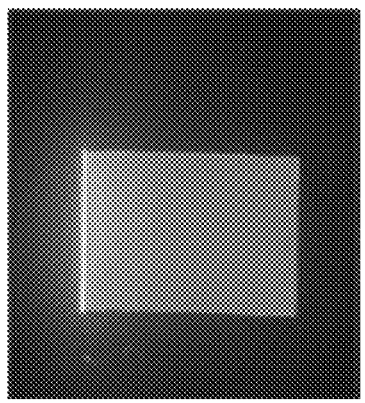
FIG. 6B is a photograph representing the light emitting display device in accordance with the comparative example in abnormal driving of blue light emitting diodes, when an electron transport layer having a smaller area than that of a hole transport layer is formed in edge areas and thus the hole transport layer directly contacts a second electrode.

FIG. 6A is a photograph representing the light emitting display device in accordance with the comparative example in normal driving of blue light emitting diodes, and FIG. 6B is a photograph representing the light emitting display device in accordance with the comparative example in abnormal driving of blue light emitting diodes, when the electron transport layer having a smaller area than that of the hole transport layer is formed in the edge areas and thus the hole transport layer directly contacts the second electrode. As exemplarily shown in FIG. 6B, when abnormal driving, blue light leakage due to abnormal driving occurs in a region, where the second electrode and a first common layer having high resistance (i.e., the hole transport layer) directly contact, at the edge of the active area.

Figure 7:
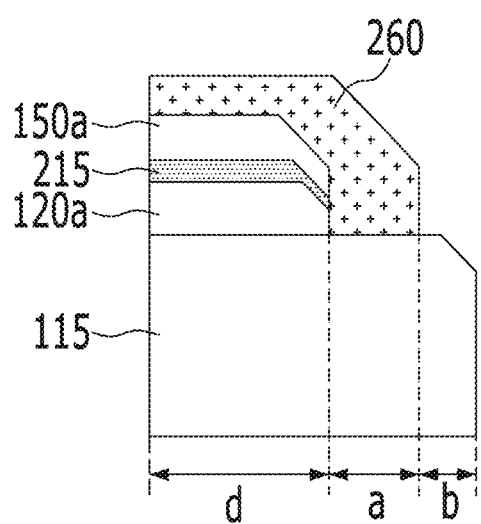
FIG. 7 is a cross-sectional view illustrating a configuration of edge areas of a light emitting display device in accordance with a second embodiment of the present invention.

FIG. 7 is a cross-sectional view illustrating a configuration of edge areas of a light emitting display device in accordance with a second embodiment of the present invention.

As exemplarily shown in FIG. 7, in the edge areas of the light emitting display device in accordance with the second embodiment of the present invention, a hole-injecting dummy layer is omitted and only a conductivity improvement layer 215 is provided, as compared to the light emitting display device in accordance with the first embodiment of the present invention shown in FIG. 4A. In this case, lower portions of a first common layer 120 (referring to FIG. 2) in the active area AA and a first common layer extension 120a in the edge areas NA can include a hole-transporting material as a dopant. In the same manner as the above-described light emitting display device in accordance with the first embodiment, in the light emitting display device in accordance with the second embodiment, the conductivity improvement layer 215 is formed such that the edge of the conductivity improvement layer 215 coincides with the edge of the first common layer extension 120a, and thus a second electrode extension 260 contacts the side of the conductivity improvement layer 215 having low resistance and thus raise in the resistance of the second electrode extension 260 and a second electrode connected thereto can be overcome. Also, even if a second common layer extension 150a is formed farther inward than the first common layer extension 120a, a second electrode extension 260 can contact the side and upper surface of the conductivity improvement layer 215 having low resistance, thus increment of contact area between the second electrode extension 260 and the conductivity improvement layer 215 can prevent the resistance of the second electrode extension 260 and a second electrode connected thereto.

A principle of preventing raise in the resistance of the second electrode through the conductivity improvement layer 119b in the light emitting display device of the present invention will be described.

Figure 8A:
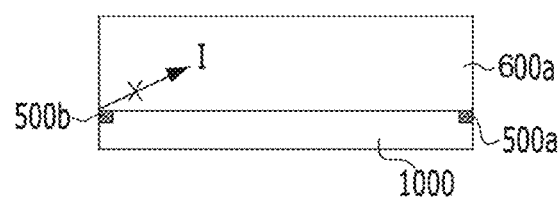
FIGS. 8A to 8C are cross-sectional views illustrating measurement of sheet resistances of light emitting display devices in accordance with first to third test examples.
Figure 8B:
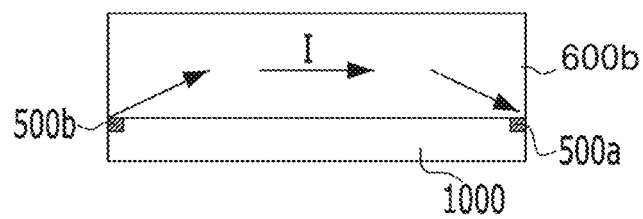
Figure 8C:
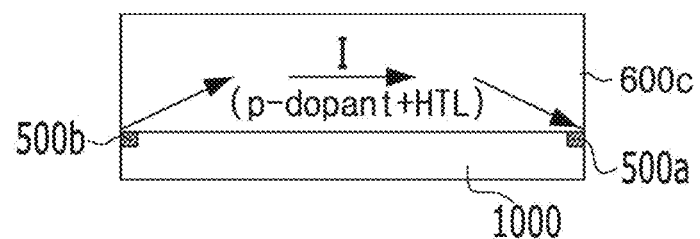
Figure 9:
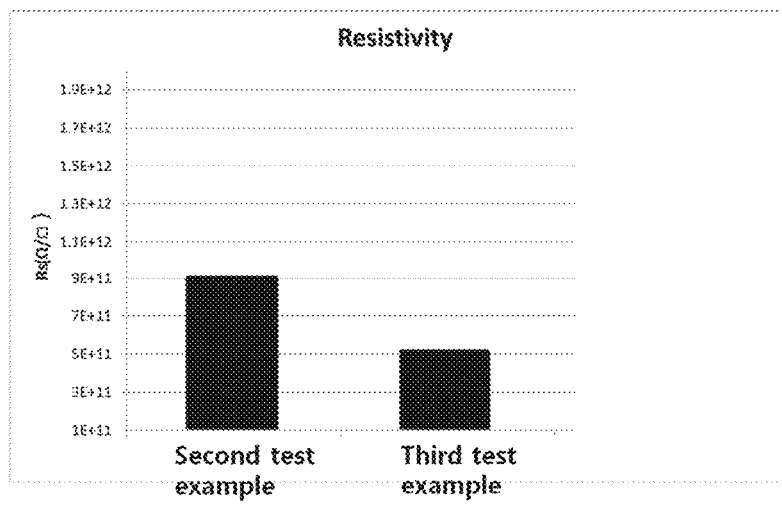
FIG. 9 is a graph representing the sheet resistances of the light emitting display devices in accordance with the first to third test examples.
Figure 10A:
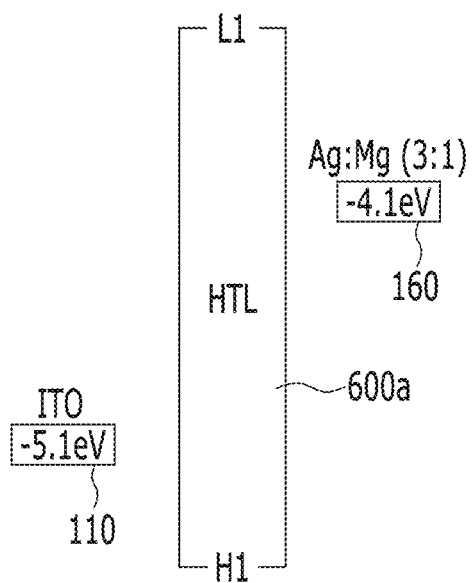
Figure 10B:
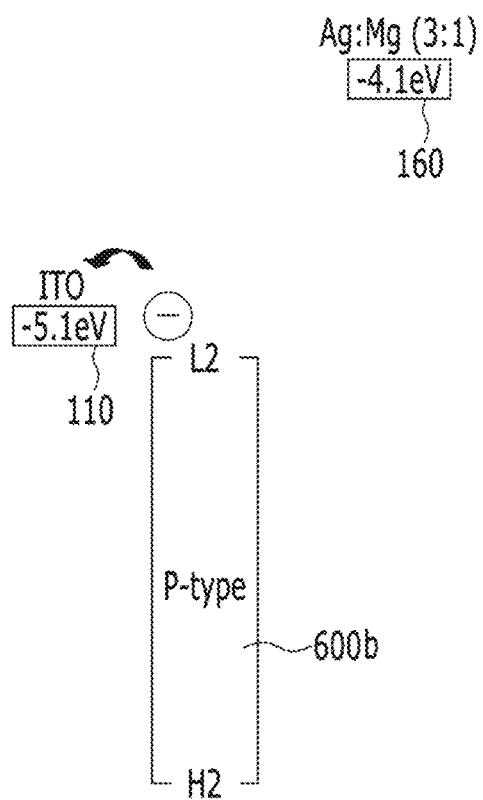

FIGS. 8A to 8C are cross-sectional views illustrating measurement of sheet resistances of light emitting display devices in accordance with first to third test examples, and FIG. 9 is a graph representing the sheet resistances of the light emitting display devices in accordance with the first to third test examples. Further, FIGS. 10A to 10C are band diagrams of the light emitting display devices in accordance with the first to third test examples.

In the first to third test examples, as exemplarily shown in FIGS. 8A to 8C, a first detection electrode 500a and a second detection electrode 500b were prepared at both ends of the upper surface of each of substrates 1000. Further, as exemplarily shown in FIGS. 8A and 8B, a first layer formed of a first material 600a used as a first common layer 120 and a second layer formed of a second material 600b used as a p-type dopant were formed on the substrates 1000 of the first and second test examples. Further, as exemplarily shown in FIG. 8C, a third layer formed of a mixture 600c of a hole-transporting material HTL to form the first common layer 120 and a p-type dopant was formed on the substrate 1000 of the third test example. The p-type dopant is the same material as the second material 600b of FIG. 8B, and employs one of the compounds expressed as the above-described chemical formulas 1 to 4. In the first to third test examples, the material layers formed on the respective substrates 1000 had the same total thickness of 100 Å. In the third test example, the content of the p-type dopant was 1 wt % to 5 wt % of the hole-transporting material HTL.

When current flows by applying a voltage difference between the first detection electrode 500a and the second detection electrode 500b in each of the first and third test examples, sheet resistance of the second layer formed of the second material 600b of the second test example was 9E+11Ω/□, sheet resistance of the third layer formed of the mixture 600c of the third test example was 5E+11Ω/□ which is measurable, but sheet resistance the first layer formed of the first material 600a of the first test example was excessively high to be exceed the measurement limit of a detector and thus cannot be measured with the detector.

Further, through the above-described test, it can be understood that, if the layer formed of the mixture 600c acquired by mixing the second material (p-type dopant) 600b with the material HTL 600a of the first common layer having high resistance is provided as in the light emitting display device of the present invention, total resistance is reduced, as compared to the case in which the layer formed of the second material 600b, i.e., a conductive material, alone is provided.

The reason for this is that the layer formed of the first material 600a, i.e., the hole-transporting material, alone has low electron mobility but, in the layer formed of the mixture 600c of the third test example, a process of filling electron vacancies with holes is repeated due to electron withdrawing characteristics of the p-type dopant, and the layer formed of the mixture 600c has improved electron mobility as compared to the layer formed of the p-type dopant 600b alone and thus improves entire conductivity.

Particularly, through the above-described test examples, it can be understood that the layer formed of the mixture 600c including a small amount of the p-type dopant having high conductivity, i.e., the second material 600b, within the hole-transporting first material 600a can lower resistance, as compared to the layer formed of the first material 600a alone or the layer formed of the p-type dopant 600b. That is, it can be expected that, if the conductivity improvement layer 119b including the p-type dopant having an small thickness is provided on the first common layer 120, as in the light emitting display device of the present invention, the resistance of the second electrode 160 is effectively lowered.

The first material can employ any material which is used to form a hole-transporting common layer, and the second material can employ one of the compounds expressed as chemical formulas 2 to 4 or any material which has p-type dopant characteristics equivalent thereto.

FIGS. 10A to 10C are band diagrams of the light emitting display devices in accordance with the first to third test examples, in which the first and second electrodes 110 and 160 are substituted for the first and second detection electrodes 500a and 500b in the first to third test examples of FIGS. 8A to 8C, in terms of electron and hole mobilities of organic light emitting diodes.

As exemplarily shown in FIG. 10A, when the layer formed of the first material 600a is provided between the first electrode 110 and the second electrode 160 of the organic light emitting diode, a difference between a first LUMO level L1 of the first material 600a and a work function of the first electrode 110 is excessively high, and thus, even if a potential difference is applied between the first and second electrodes 110 and 160, an energy barrier from the first material 600a to the first electrode 110 is excessively high and flow of electrons is almost impossible.

As exemplarily shown in FIG. 10B, when the layer formed of the second material 600b having a second LUMO level L2, which is low to be similar to the work function of the first electrode 110, such as a p-type dopant, is provided between the first electrode 110 and the second electrode 160 of the organic light emitting diode, electrons flow via the low second LUMO level L2 and thus conductivity can be raised.

As exemplarily shown in FIG. 10C, when the layer formed of the mixture 600c acquired by mixing the second material (p-type dopant) 600b with the material (hole-transporting layer: HTL) is provided between the first electrode 110 and the second electrode 160 of the organic light emitting diode, as in the light emitting display device of the present invention, the layer formed of the mixture 600c steals electrons from the first material (HTL) 600a due to electron withdrawing characteristics of the second material (p-type dopant) 600b, and thereby, the first material (HTL) 600a relatively lacks electrons, holes are generated in the first material (HTL) 600a, and thus carrier mobility to the light emitting diodes and conductivity of the light emitting diodes are increased.

Hereinafter, a method for manufacturing the light emitting display device in accordance with an embodiment of the present invention will be described.

First, as exemplarily shown in FIGS. 1B and 2, the substrate 100 having the active area AA having a plurality of subpixels and the edge areas NA around the active area AA is prepared.

The thin film transistor array including thin film transistors TFTs corresponding to the respective subpixels is formed on the substrate 100.

Thereafter, the inorganic protective film 108 and the organic protective film 109 are sequentially deposited on the thin film transistor array and are selectively removed to expose the drain electrodes 106 of the thin film transistors TFTs, and the first electrodes 110 connected to the drain electrodes 106 are provided.

Figure 12A:
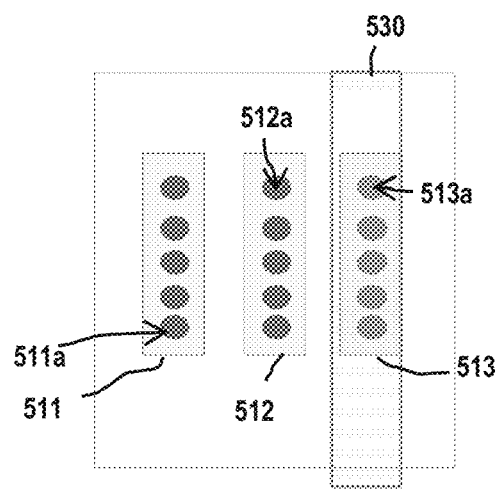
FIGS. 12A to 12E are views illustrating arrangements of deposition sources respectively used in operations of FIGS. 11A to 11E.
Figure 12B:
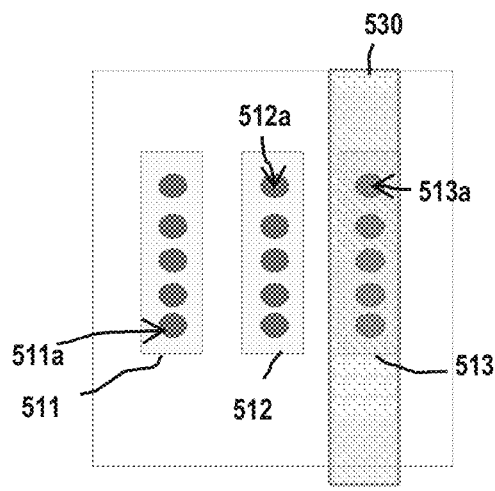
Figure 12C:
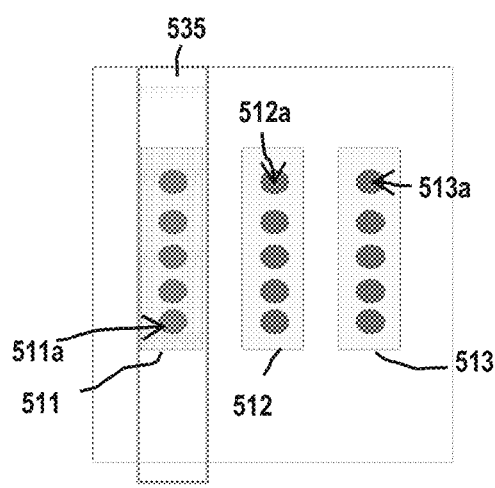
Figure 12D:
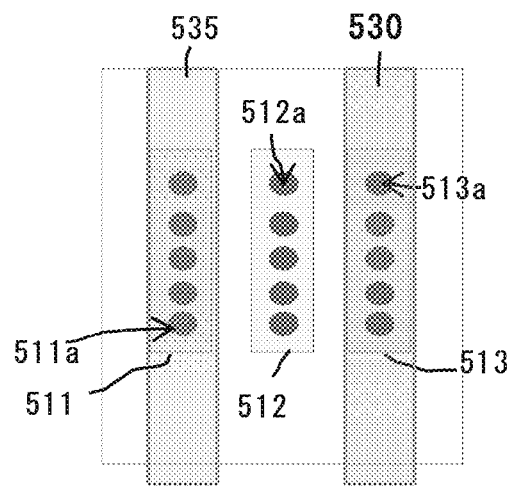
Figure 12E:
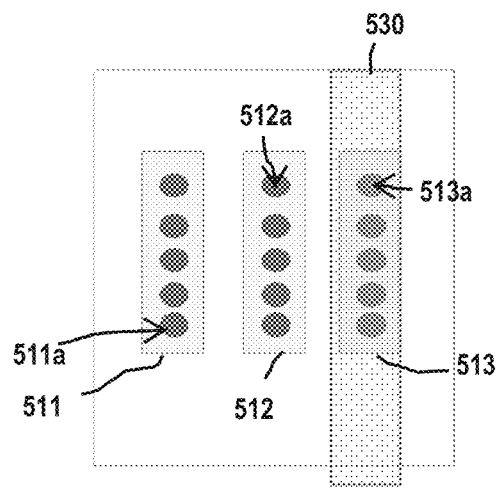
Figure 13A:
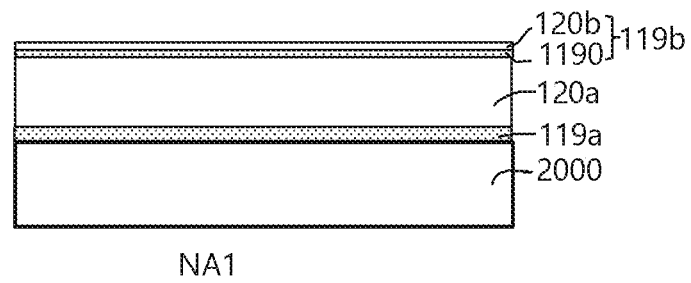
FIG. 13A is a cross-sectional view illustrating a structure of the edge area corresponding to deposition materials in the initial stage of a deposition process, after completion of the operation of FIG. 11E.
Figure 13B:
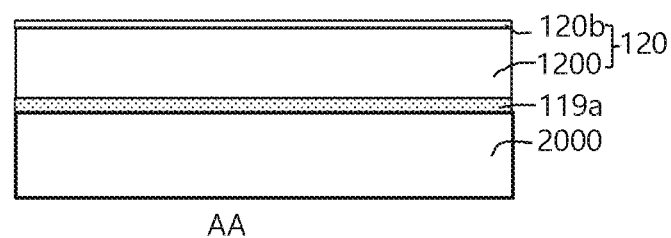
FIG. 13B is a cross-sectional view illustrating a structure of the active area, after completion of the operation of FIG. 11E.
Figure 13C:
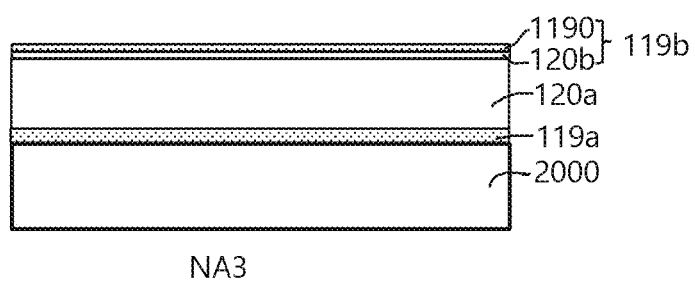
FIG. 13C is a cross-sectional view illustrating a structure of the edge area corresponding to the deposition materials in the final stage of the deposition process, after completion of the operation of FIG. 11E.

The features of the present invention can be characterized in that the first common layer 120/the first common layer extension 120a, the conductivity improvement layer 119b and the hole-injecting dummy layer 119a are formed in the same chamber through the same process, and thus descriptions of formation thereof will be focused upon. FIGS. 11A to 11E are process views illustrating a method for forming the first common layer and the conductivity improvement layer of the light emitting display device in accordance with the present invention, and FIGS. 12A to 12E are views illustrating arrangements of deposition sources respectively used in operations of FIGS. 11A to 11E. FIG. 13A is a cross-sectional view illustrating a structure of the edge area corresponding to deposition materials in the initial stage of a deposition process, after completion of the operation of FIG. 11E, FIG. 13B is a cross-sectional view illustrating a structure of the active area, after completion of the operation of FIG. 11E, and FIG. 13C is a cross-sectional view illustrating a structure of the edge area corresponding to the deposition materials in the final stage of the deposition process, after completion of the operation of FIG. 11E.

Formation of the first common layer 120, the conductivity improvement layer 119b and the hole-injecting dummy layer 119a (Operations S1-S5) is carried out using the same mask 540 in the same chamber 800.

Figure 11A:
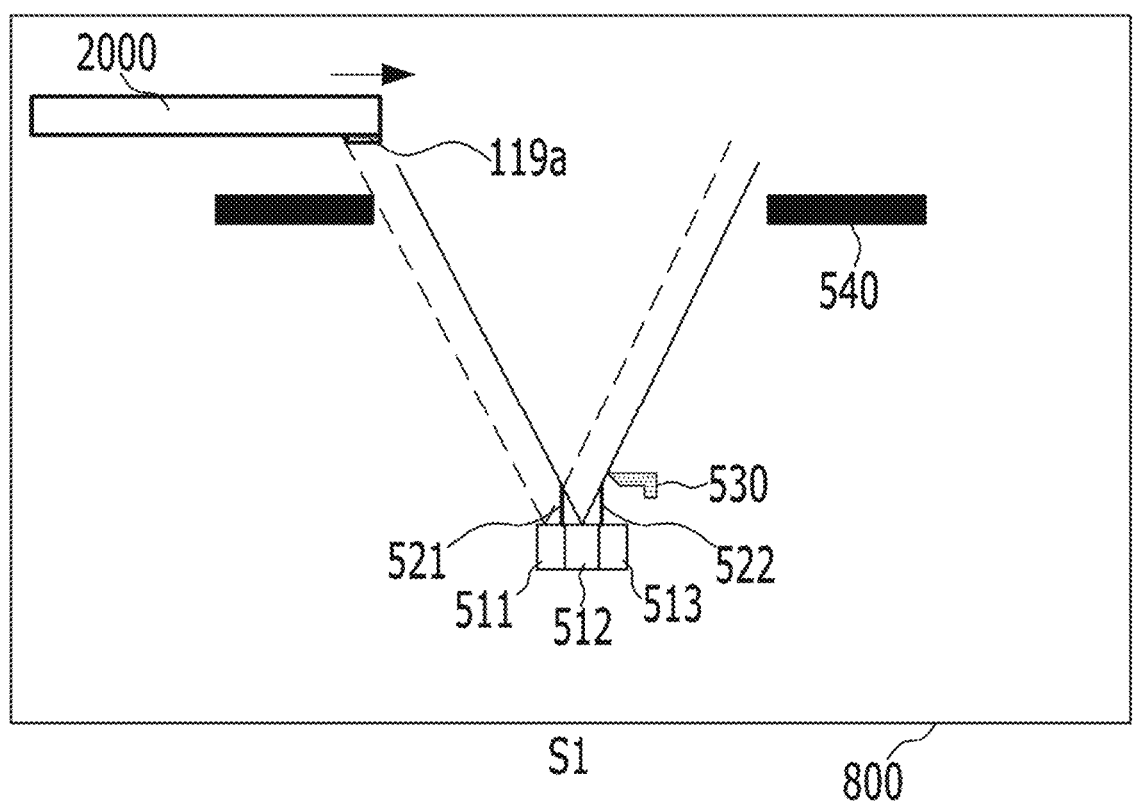
FIGS. 11A to 11E are process views illustrating a method for forming a first common layer and a conductivity improvement layer of the light emitting display device in accordance with the present invention.

As exemplarily shown in FIG. 11A, a first common layer material deposition source 512 and first and second p-type dopant material deposition sources 511 and 513 located at both sides thereof, which can deposit respective components thereof by vaporization through crucibles provided thereunder, are prepared in the chamber 800. As exemplarily shown in FIG. 12A, the first common layer material deposition source 512 and the first and second p-type dopant material deposition sources 511 and 513 respectively have a plurality of supply openings 512a, 511a and 513a which are arranged in a row, and the supply openings 511a and 513a of the first and second p-type dopant material deposition sources 511 and 513 can be selectively opened and closed by shutters 530 and 535 (in FIG. 11C) according to the sequence of the deposition process.

Further, a common mark 540 having an opening having a size to cover the width of the active area AA and the first intervals c at both ends of the width of the active area AA in which the first common layer extension 120*a* can be formed, as described above referring to FIG. 1B, is provided above the first common layer material deposition source 512 and the first and second p-type dopant material deposition sources 511 and 513.

Inner angle correction plates 521 and 522 to define a deposition angle of the materials from the deposition sources 512, 511 and 513 which are deposited on the substrate 100 are further provided between the upper surfaces of the first common layer material deposition source 512 and the first and second p-type dopant material deposition sources 511 and 513 and the lower surface of the common mask 540. The inner angle correction plates 521 and 522 can be provided according to the respective deposition sources 512, 511 and 513, or can be provided at boundaries among the deposition sources 512, 511 and 513.

Further, a substrate 2000 provided with first electrodes 110 connected to the drain electrodes 106 of the above-described thin film transistors is provided above the common mask 540, and the deposition process in which lower deposition materials are deposited onto the substrate 2000 through the opening of the common mask 540 is carried out, while the substrate 2000 is moved.

The substrate 2000 has an active area AA and edge areas NA (or BZP) around the active area AA, as exemplarily shown in FIG. 1B.

Further, although not shown in the drawings for convenience, the first electrodes 110 (referring to FIG. 2) are formed on the thin film transistor array in the respective subpixels.

Here, when the substrate 2000 is moved in the rightward direction, as exemplarily shown in FIG. 11A, the deposition materials are deposited onto the substrate 200 from right to left. Although not shown in the drawings, when the substrate 2000 is moved in the leftward direction, deposition is carried out on the substrate 200 from left to right.

At an initial scanning stage of the deposition materials, the supply openings 511*a* and 512*a* of the first p-type dopant material deposition source 511 and the first common layer material deposition source 512 are opened, the supply openings 513*a* of the second p-type dopant material deposition source 513 are closed with a first shutter 530, and then the deposition process is carried out.

As exemplarily shown in FIG. 11A, when the substrate 2000 is moved in the rightward direction and primarily corresponds to the opening of the common mask 540, the hole-injecting dummy layer 119*a* alone is formed in some of the edge areas of the substrate 2000 by supplying the deposition material from the first p-type dopant material deposition source 511 located at the leftmost position through the opening of the common mask 540. When the hole-injecting dummy layer 119*a* is formed, the supply openings 511*a* and 512*a* of the first p-type dopant material deposition source 511 and the first common layer material deposition source 512 are opened, and thus deposition of the hole-injecting dummy layer 119*a* is carried out by partially mixing a p-type dopant material and a first common layer material supplied from the first p-type dopant material deposition source 511 and the first common layer material deposition source 512.

As exemplarily shown in FIG. 11A, since the p-type dopant material from the first p-type dopant material deposition source 511 is first supplied to an advancing side of the substrate 2000, the hole-injecting dummy layer 119*a* includes the p-type dopant material mixed with the first common layer material. When the substrate 2000 of FIG. 11A first corresponds to a deposition material supply unit, in order to secure a designated thickness of the hole-injecting dummy layer 119*a*, a supply amount of the p-type dopant material from the first p-type dopant material deposition source 511 can be increased at an initial stage of rightward movement of the substrate 2000.

Figure 11B:
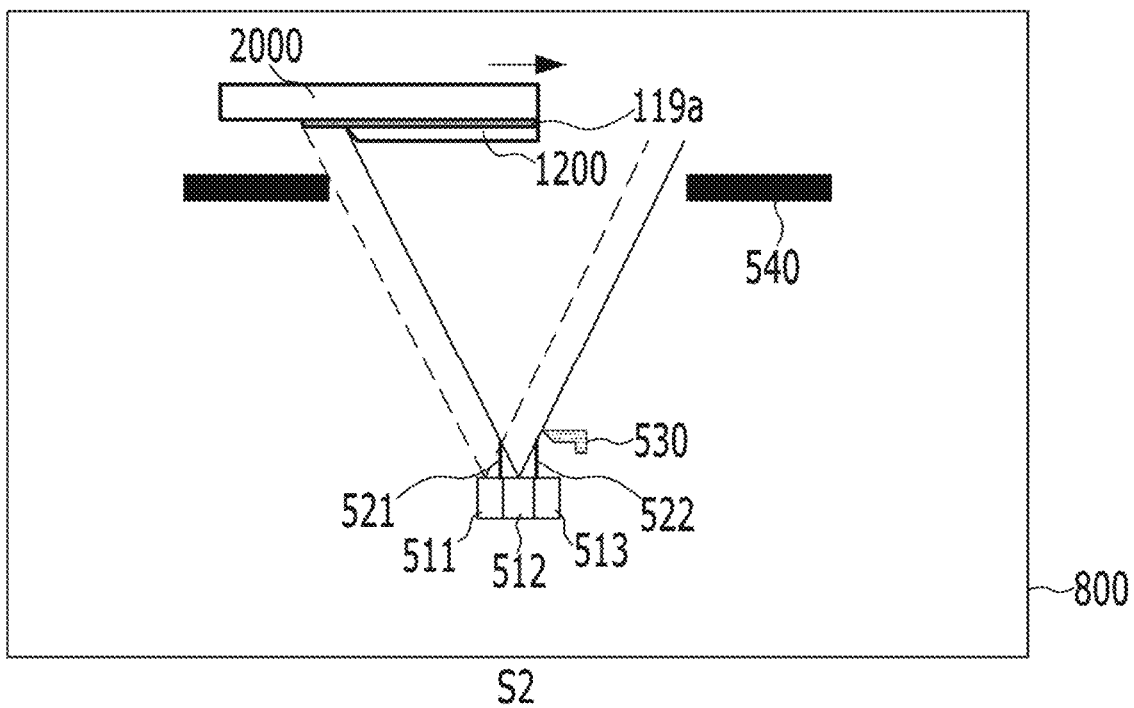

Subsequently, as exemplarily shown in FIGS. 11B and 12B, the substrate 2000 is continuously moved in the rightward direction, and a first common material layer 1200 formed of the first common layer material is formed on the substrate 2000 provided with the hole-injecting dummy layer 119 thereon. The first common material layer 1200 includes the first common layer 120 in the active area AA and the first common layer extension 120*a* in the edge areas NA, as described above referring to FIGS. 1A and 1B. The first common material layer 1200 is formed of the same material to have the same thickness in both the active area AA and the edge areas NA.

Since the amount of the first common layer material supplied from the first common layer material deposition source 512 is much greater than the amount of the p-type dopant material supplied from the first p-type dopant material deposition source 511, the first common material layer 1200 can be formed. A supply region of the p-type dopant material from the first p-type dopant material deposition source 511 partially overlaps a supply region of the first common layer material from the first common layer material deposition source 512 in the moving direction of the substrate 2000, and thus the lower portion of the first common material layer 1200 can include a small amount of the p-type dopant material.

Figure 11C:
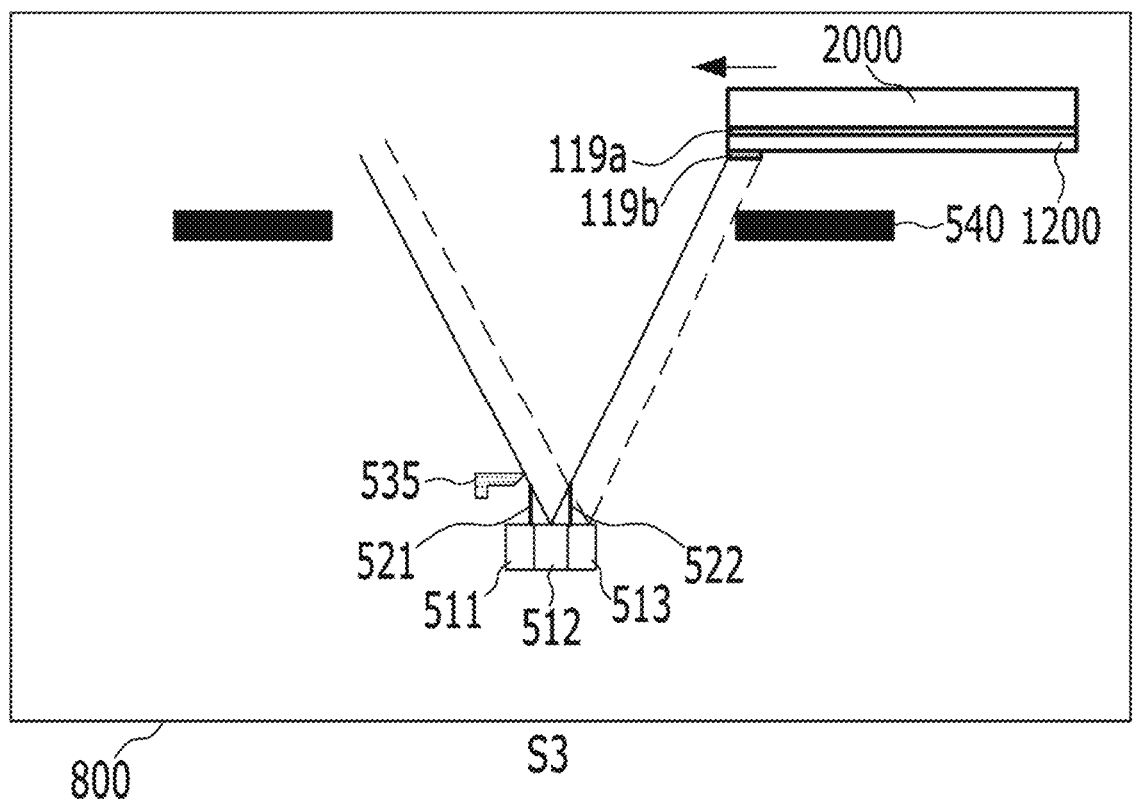
Figure 11D:
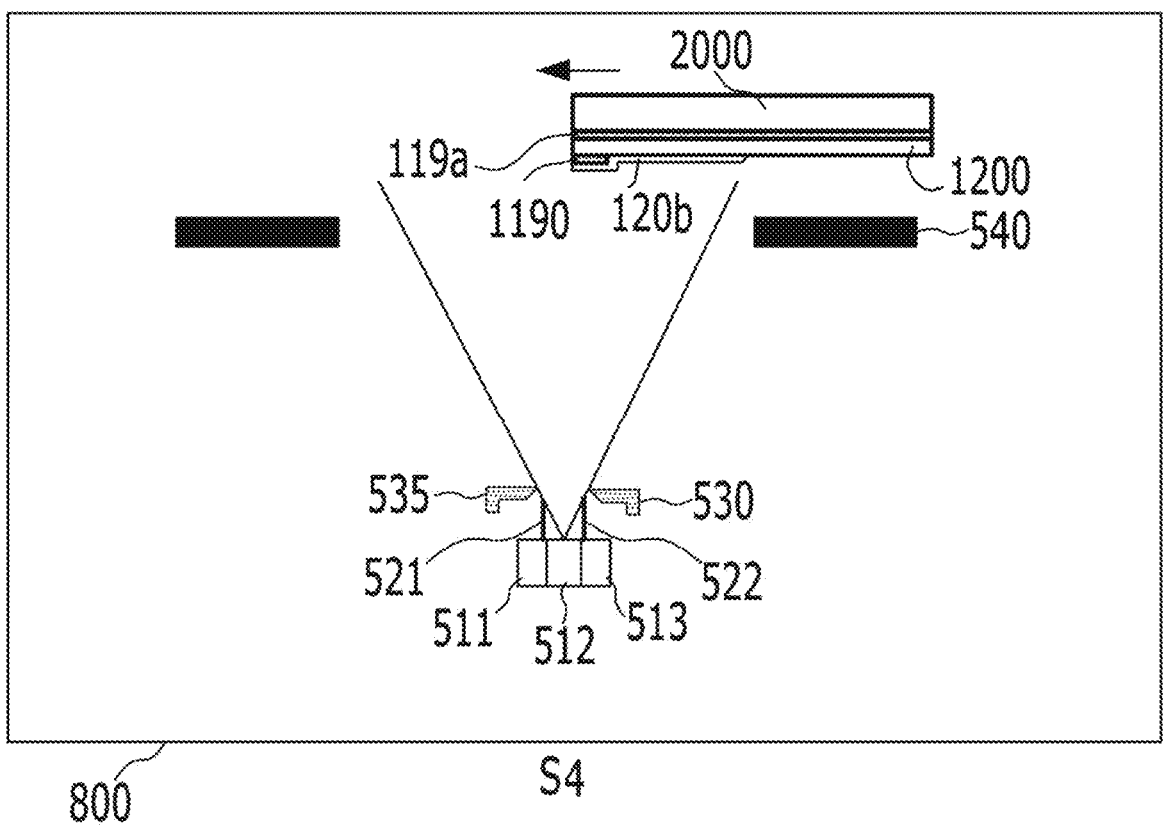
Figure 11E:
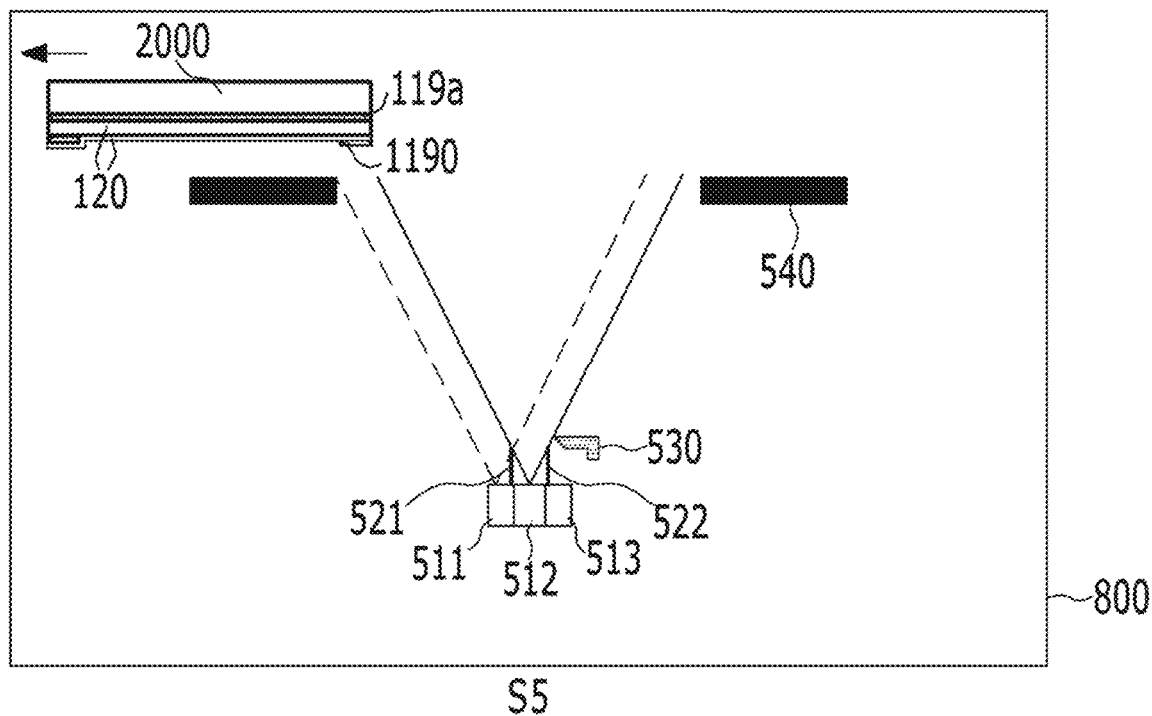

After formation of the hole-injecting dummy layer 119*a* and the first common material layer 1200 in the entire area of the substrate 2000 or in the entire active area and some of the edge areas of the substrate 200 has been completed, as such, the substrate 2000 is moved in the opposite direction, as exemplarily shown in FIG. 11C. Here, a second shutter 535 is provided above the first p-type dopant material deposition source 511 so as to prevent supply of the p-type dopant material from the first p-type dopant material deposition source 511. In an initial stage of leftward movement of the substrate 2000, a p-type dopant material 1190 is deposited onto the upper surface of the first common material layer 1200 in the left edge area (the edge area NA1 in FIG. 13A). Subsequently, as exemplarily shown in FIG. 11D, while the substrate 2000 is continuously moved in the leftward direction, a first common layer material 120*b* is deposited onto the active area. Here, as exemplarily shown in FIG. 12D, the second shutter 535 and the first shutter 530 are provided above the first p-type dopant material deposition source 511 and the second p-type dopant material deposition source 513 so that the first common layer material 120*b* alone is supplied to the active area, and thus, the first common layer material 120*b* alone is deposited on the upper surface of the first common material layer 1200 in the active area AA without the p-type dopant.

Subsequently, as exemplarily shown in FIGS. 11E and 12E, when opening of the common mask 540 corresponds to the right edge area (the edge area NA3 in FIG. 13C) of the substrate 2000, the openings 511*a* of the first p-type dopant material deposition source 511 are opened by removing the first shutter 535 above the first p-type dopant material deposition source 511, and thus the p-type dopant material 1190 is deposited onto the right edge area of the substrate 200.

Through the above formation process, the p-type dopant material 1190 and the first common layer material 120b are mixed and remain on the upper surface of the first common layer extension 120a in the edge areas and thus form the conductivity improvement layer 119b, as exemplarily shown in FIGS. 13A and 13C, and the first common layer material 120b alone remains in the active area, as exemplarily shown in FIG. 13B.

The initial shapes of the conductivity improvement layer 119b located in the first and third edge areas NA1 and NA3 located at positions opposite to each other in the moving direction of the substrate 200 can be different according to the position of the layer formed of the p-type dopant material 1190, as exemplarily shown in FIGS. 13A and 13C.

Here, as exemplarily shown in FIGS. 13A and 13C, although the position of the layer formed of the p-type dopant material 1190 is varied, the first common material layer 120a substantially has a large thickness of about 200-1000 Å, and the layer formed of the p-type dopant material 1190 and the layer formed of the first common layer material 120b which are located on the first common material layer 120a have a total thickness of less than 50 Å after stacking of the two layers, and have effects of the conductivity improvement layer 119b in which the p-type dopant material 1190 is mixed with the first common layer material 120b, after a specific period of time passes in the chamber 800. Further, after the substrate 2000 is unloaded from the chamber 800, cleaning is carried out before a process of forming light emitting layers, and thus separation from subsequent layers is possible.

Further, after the formation process shown in FIGS. 11A to 11E, the first common material layer 1200 and the layer formed of the first common layer material 120b, which are sequentially deposited in the active area, are not discriminated from each other, thus forming a single first common layer 120, as exemplarily shown in FIG. 13B.

In this case, the layer formed of the first common layer material 120b is not provided but only the first common layer extension 120a formed of the first common material layer 1200 remains under the conductivity improvement layer 119b in the first edge area NA1, and thus the first common layer extension 120a in the first edge area NA1 has a smaller thickness than the first common material layer 1200 in the active area AA. On the other hand, as exemplarily shown in FIG. 13C, the layer formed of the first common layer material 120b remains on the first common layer extension 120a in the third edge area NA3 corresponding to a first common layer material supply ending part, similarly to the active area, and thus the layer formed of the first common layer material 120b having the same thickness of the first common layer 120 in the active area AA can remain in some of the edge areas NA.

For example, in the above-described deposition method of the light emitting display device in accordance with the present invention, the conductivity improvement layer 119b is formed by supplying a conductivity improving material corresponding to first common layer material supply starting part and ending part of the substrate 2000 (the first edge area and third edge area of the substrate 2000 opposite to each other or the second edge area and fourth edge area of the substrate 2000 opposite to each other) from the first common layer material deposition source, as exemplarily shown in FIG. 1B.

Thereby, a part or the entirety of the upper portion of the first common layer extension 120a (in FIG. 1B) in the edge areas NA can be the conductive improvement layer 119b. For example, as exemplarily shown in FIG. 1B, the conductivity improvement layer 119b may not be formed on the first common layer extension 120 located in the second and fourth edge areas NA2 and NA4. In this case, in the second and fourth edge areas NA2 and NA4, the first common layer extension 120a formed of the same common layer material as the first common layer 120 in the active area AA and having the same thickness of the first common layer 120 is provided.

The first common layer 120 formed through the above process is formed integrally with the first common layer extension 120a having the first interval c (referring to FIG. 1B) in the edge areas, and the first common layer extension 120a protrudes from the first common layer 120 in the active area AA by the first interval c.

Although, in the examples of the present invention, the conductivity improvement layer 119b and the hole-injecting dummy layer 119a are formed of the same material, the conductivity improvement layer 119b and the hole-injecting dummy layer 119a can be formed of different materials by additionally disposing a hole injecting material deposition source adjacent to the first common layer material deposition source 152 to supply the first common layer material in the chamber 800.

After formation of the conductivity improvement layer 119b, the light emitting layers 140: 140r, 140g and 140b are formed in the respective pixels RP, GP and BP.

Thereafter, the second common layer 150 having a greater size than the active area AA is provided on the light emitting layers 140: 140r, 140g and 140b. A part of the second common layer 150 formed outside the active area AA is defined as the second common layer extension 150a.

Thereafter, the second electrode 160 including the second electrode extension 160a having the second process margin (the second interval a) in the edge areas NA to cover at least the first common layer 120 and the first common layer extension 120a is formed on the second common layer 150 and the second common layer extension 150a.

The second interval a is provided outside the first interval c and thus the second electrode extension 160a extends to the outermost position out of the elements of the light emitting diode. For example, the second interval a can have a distance of 100 μm or more outward from the edge of the first interval c, and the edge of the second common layer extension 150a can be located between the first common layer extension 120a and the second electrode extension 160a.

As described above, the light emitting display device in accordance with one or more embodiments of the present invention further includes the conductivity improvement layer corresponding to the edge of the first common layer having high resistance, thus preventing raise in resistance in the edge areas.

Further, if common layers formed subsequent to formation of the first common layer and the conductivity improvement layer have no process margins, the second electrode contacts the conductivity improvement layer other than the first common layer in the edge areas, and thus conductivity of the second electrode can be maintained and reduction in luminance or abnormal driving in a specific region can be prevented.

In addition, in the method for manufacturing the light emitting display device in accordance with one or more embodiments of the present invention, even if a mask used to form the conductivity improvement layer is not additionally provided, the conductivity improvement layer can be restrictively formed in the edge areas by causing the conductivity improving material deposition sources to selectively correspond to the substrate at a starting time and an ending time of first common layer material supply. For instance, without addition of or change in deposition, masks the light emitting display device can secure uniform luminescent characteristics due to selective formation of the conductivity improvement layer.

Further, the light emitting display device in accordance with one or more embodiments of the present invention can have uniform luminance throughout the entirety of the active area without increase in resistance even if the conductivity improvement layer contacts the second electrode located on the conductivity improvement layer, the second common layer(s) formed after formation of the conductivity improvement layer can have a degree of freedom, process margins thereof in the edge areas can be reduced or omitted, and thus a narrow bezel can be achieved.

Moreover, the light emitting display device in accordance with one or more embodiments of the present invention can form the second common layer having a reduced process margin or no process margin, minimize the area occupied by of the second electrode located on the second common layer outside the first common layer, and thus reduce a region in which organic common layers are provided, in the edge areas. Therefore, some of the edge areas which do not overlap the organic common layers and the second electrode can be secured as regions to mount various parts, such as a camera hole, a printed circuit film, etc. thereon, and thus the light emitting display device in accordance with the present invention can be applied to various designs.

In addition, the light emitting display device in accordance with one or more embodiments of the present invention can define a process margin of the light emitting diodes shown in FIGS. 1A and 1B as only the sum of the first interval c of the first common layer extension 120a and the second interval a of the second electrode extension 160a, thus remarkably reducing the process margin generated in the deposition process of the light emitting diodes.

As apparent from the above description, a light emitting display device and a method for manufacturing the same in accordance with one or more embodiments of the present invention have advantages and effects as follows.

First, the light emitting display device in accordance with one or more embodiments of the present invention further includes a conductivity improvement layer corresponding to the edge of a first common layer having high resistance, thus preventing raise in resistance in edge areas.

Second, if common layers formed subsequent to formation of the first common layer and the conductivity improvement layer have no process margins, a second electrode contacts the conductivity improvement layer other than the first common layer in the edge areas, and thus conductivity of the second electrode can be maintained and reduction in luminance or abnormal driving in a specific region can be prevented.

Third, even if a mask used to form the conductivity improvement layer is not additionally provided, the conductivity improvement layer can be restrictively formed in the edge areas by causing conductivity improving material deposition sources to selectively correspond to a substrate at a starting time and an ending time of first common layer material supply. That is, without addition of or change in deposition, masks the light emitting display device can secure uniform luminescent characteristics due to selective formation of the conductivity improvement layer.

Fourth, the light emitting display device in accordance with one or more embodiments of the present invention can have uniform luminance throughout the active area without increase in resistance even if the conductivity improvement layer contacts the second electrode located on the conductivity improvement layer, second common layer(s) formed after formation of the conductivity improvement layer can have a degree of freedom, process margins thereof in the edge areas can be reduced or omitted, and thus a narrow bezel can be achieved.

Fifth, the light emitting display device in accordance with one or more embodiments of the present invention can form the second common layer having a reduced process margin or no process margin, minimize the area occupied by the second electrode located on the second common layer outside the first common layer, and thus reduce a region in which organic common layers are provided, in the edge areas. Therefore, some of the edge areas which do not overlap the organic common layers and the second electrode can be secured as regions to mount various parts, such as a camera hole, a printed circuit film, etc. thereon, and thus the light emitting display device in accordance with the present invention can be applied to various designs.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. A light emitting display device comprising:
   a substrate having an active area and a non-display area surrounding the active area;
   a plurality of subpixels provided in the active area of the substrate;
   an organic light emitting diode including a first electrode, a first common layer, a light emitting layer, a second common layer and a second electrode stacked at each subpixel;
   a first common layer extension configured to extend from the first common layer to the non-display area, the first common layer extension being at an outside of the plurality of subpixels,
   a conductivity improvement layer configured to contact an upper surface of the first common layer extension positioned at at least one side of the substrate among the non-display area of the substrate; and
   a second electrode extension configured to extend from the second electrode to the non-display area and to overlap the conductivity improvement layer, and provided to be closer to edges of the non-display area than the conductivity improvement layer.

2. The light emitting display device according to claim 1, wherein the conductivity improvement layer is at least provided at a first side and a second side of the substrate, opposite to each other.

3. The light emitting display device according to claim 2, wherein the conductivity improvement layer comprises a p-type dopant and the same material as a material included in the first common layer.

4. The light emitting display device according to claim 2, wherein the first common layer extension directly contacts another common layer extension between the first side and the second side of the substrate.

5. The light emitting display device according to claim 3, wherein positions of the p-type dopant in the conductivity improvement layer are vertically different at the first and second sides of the substrate.

6. The light emitting display device according to claim 3, wherein the p-type dopant in the conductivity improvement layer includes an organic material having electron withdrawing characteristics.

7. The light emitting display device according to claim 1, wherein the conductivity improvement layer lowers a sheet resistance of the first common layer extension located below the second electrode extension in a vertical direction.

8. The light emitting display device according to claim 1, wherein the first common layer in the active area has a greater thickness than a thickness of the first common layer extension in the non-display area.

9. The light emitting display device according to claim 1, wherein the conductivity improvement layer is spaced apart from the plurality of subpixels.

10. The light emitting display device according to claim 1, further comprising a second common layer extension configured to extend from the second common layer and provided at the non-display area.

11. The light emitting display device according to claim 10, wherein the second common layer extension contacts an upper surface of the conductivity improvement layer.

12. The light emitting display device according to claim 10, wherein the conductivity improvement layer has a greater contact area with the second electrode than the second common layer extension, at the non-display area.

13. The light emitting display device according to claim 11, wherein a lower surface of the second common layer extension contacts upper and side surfaces of the conductivity improvement layer.

14. The light emitting display device according to claim 11, wherein:
the second common layer and the second common layer extension comprise electron-transporting or electron-injecting organic matter as a main component; and
the first common layer and the first common layer extension comprise hole-transporting organic matter as a main component.

15. The light emitting display device according to claim 11, wherein:
the second common layer and the second common layer extension comprise a plurality of layers; and
the second electrode extension in the non-display area is located closer to an outermost edge of the non-display area than the respective layers of the second common layer extension.

16. The light emitting display device according to claim 1, further comprising a hole-injecting dummy layer contacting lower surfaces of the first common layer and the first common layer extension.

17. The light emitting display device according to claim 16, wherein the conductivity improvement layer and the hole-injecting dummy layer comprise the same material.

18. The light emitting display device according to claim 1, wherein the conductivity improvement layer does not overlap the plurality of pixels.

19. The light emitting display device according to claim 1, wherein the second electrode extension laterally contacts the conductivity improvement layer.

20. A light emitting display device comprising:
a substrate having an active area and edge areas surrounding the active area;
a plurality of subpixels provided in the active area of the substrate;
an organic light emitting diode including a first electrode, a first common layer, a light emitting layer, a second common layer and a second electrode stacked at each subpixel;
a first common layer extension configured to extend from the first common layer to the edge areas at an outside of the plurality of subpixels;
a conductivity improvement layer configured to contact an upper surface of the first common layer extension positioned at at least one side of the substrate among edge areas of the substrate;
a second common layer extension configured to extend from the second common layer and provided in the edge areas; and
a second electrode extension configured to extend from the second electrode to the edge areas and to overlap the conductivity improvement layer, and provided to be closer to edges of the edge areas than the conductivity improvement layer,
wherein the conductivity improvement layer protrudes closer to an outermost edge of the edge areas than the second common layer extension.

21. The light emitting display device according to claim 20, wherein a lower surface of the second electrode extension contacts upper and side surfaces of the second common layer extension and a side surface of the first common layer extension protruding from the second common layer extension closer to the outmost edge of the edge areas.

* * * * *